US012107106B2

(12) United States Patent
Baba et al.

(10) Patent No.: US 12,107,106 B2
(45) Date of Patent: Oct. 1, 2024

(54) SOLID-STATE IMAGING DEVICE INCLUDING GROOVE WITH RECESSED AND PROJECTING SIDEWALLS

(71) Applicant: SONY SEMICONDUCTOR SOLUTIONS CORPORATION, Kanagawa (JP)

(72) Inventors: Tomohiko Baba, Kanagawa (JP); Naoki Hideshima, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 708 days.

(21) Appl. No.: 17/250,775

(22) PCT Filed: Aug. 7, 2019

(86) PCT No.: PCT/JP2019/031065
§ 371 (c)(1),
(2) Date: Mar. 2, 2021

(87) PCT Pub. No.: WO2020/054272
PCT Pub. Date: Mar. 19, 2020

(65) Prior Publication Data
US 2021/0202561 A1 Jul. 1, 2021

(30) Foreign Application Priority Data
Sep. 11, 2018 (JP) .................. 2018-169729
Jul. 23, 2019 (JP) .................. 2019-135147

(51) Int. Cl.
H01L 27/14 (2006.01)
H01L 27/146 (2006.01)

(52) U.S. Cl.
CPC .. *H01L 27/14632* (2013.01); *H01L 27/14618* (2013.01); *H01L 27/14621* (2013.01);
(Continued)

(58) Field of Classification Search
CPC ......... H01L 27/14632; H01L 27/14618; H01L 27/14621; H01L 27/14623;
(Continued)

(56) References Cited

U.S. PATENT DOCUMENTS 5,811,790 A * 9/1998 Endo ................. H01L 31/02322
257/469
2004/0051124 A1* 3/2004 Kawasaki ......... H01L 27/14643
257/258

(Continued)

FOREIGN PATENT DOCUMENTS

CN 101435905 A 5/2009
CN 108463887 8/2018
(Continued)

OTHER PUBLICATIONS

International Search Report and Written Opinion of PCT Application No. PCT/JP2019/031065, issued on Oct. 29, 2019, 10 pages of ISRWO.

*Primary Examiner* — Ida M Soward
(74) *Attorney, Agent, or Firm* — CHIP LAW GROUP

(57) ABSTRACT

A solid-state imaging device includes a substrate on which a plurality of photoelectric conversion units has been formed, a groove portion provided on a side of a light-receiving surface of the substrate, and recessed and projecting portions provided on a side wall surface of the groove portion facing a side of the plurality of photoelectric conversion units.

14 Claims, 24 Drawing Sheets

(52) U.S. Cl.
CPC .. *H01L 27/14623* (2013.01); *H01L 27/14627* (2013.01); *H01L 27/14645* (2013.01)

(58) Field of Classification Search
CPC ......... H01L 27/14627; H01L 27/14645; H01L 27/14605; H01L 27/14629
See application file for complete search history.

(56) References Cited

U.S. PATENT DOCUMENTS

| | | | | |
|---|---|---|---|---|
| 2008/0239522 | A1* | 10/2008 | Kinoshita | ......... H01L 27/14618 359/822 |
| 2009/0121304 | A1* | 5/2009 | Terada | ................ H01L 31/0203 257/434 |
| 2009/0283311 | A1* | 11/2009 | Ida | .................... H01L 27/14683 29/846 |
| 2010/0073532 | A1* | 3/2010 | Yano | ....................... C04B 28/02 359/503 |
| 2013/0118560 | A1* | 5/2013 | Yamaguchi | ........... H01L 31/048 136/251 |
| 2013/0264599 | A1 | 10/2013 | Kikuchi et al. | |
| 2016/0155862 | A1* | 6/2016 | Hong | ...................... H01L 24/32 257/432 |
| 2018/0097029 | A1* | 4/2018 | Kurihara | ........... H01L 27/14627 |

FOREIGN PATENT DOCUMENTS

| | | | | |
|---|---|---|---|---|
| JP | 2003243410 A | * | 8/2003 | ......... H01L 21/8249 |
| JP | 2009-123848 A | | 6/2009 | |
| JP | 2010-278501 A | | 12/2010 | |
| JP | 2014-082514 A | | 5/2014 | |
| JP | 2015-012474 A | | 1/2015 | |
| JP | 2015-159275 A | | 9/2015 | |
| JP | 2016-004826 A | | 1/2016 | |
| TW | 201044619 A1 | | 12/2010 | |
| TW | 201101473 A1 | | 1/2011 | |
| TW | 201101526 A1 | | 1/2011 | |
| WO | 2012/093426 A1 | | 7/2012 | |

* cited by examiner

SOLID-STATE IMAGING DEVICE INCLUDING GROOVE WITH RECESSED AND PROJECTING SIDEWALLS

CROSS REFERENCE TO RELATED APPLICATIONS

This application is a U.S. National Phase of International Patent Application No. PCT/JP2019/031065 filed on Aug. 7, 2019, which claims priority benefit of Japanese Patent Application No. JP 2018-169729 filed in the Japan Patent Office on Sep. 11, 2018 and Japanese Patent Application No. JP 2019-135147 filed in the Japan Patent Office on Jul. 23, 2019. Each of the above-referenced applications is hereby incorporated herein by reference in its entirety.

TECHNICAL FIELD

The present technology relates to a solid-state imaging device and an electronic apparatus.

BACKGROUND ART

Conventionally, there has been proposed a solid-state imaging device in which a groove portion surrounding a pixel region is formed between a scribe region and a pixel region (see, for example, Patent Literature 1). In the solid-state imaging device described in Patent Literature 1, film peeling and cracking generated when a wafer is divided are stopped by the groove portion.

CITATION LIST

Patent Literature

Patent Literature 1: Japanese Patent Application Laid-open No. 2015-159275

DISCLOSURE OF INVENTION

Technical Problem

However, in the solid-state imaging device described in Patent Literature 1, there is a possibility that incident light to the solid-state imaging device is reflected by a side wall surface or a bottom surface of the groove portion, the reflected incident light is reflected by a cover glass or an imaging lens disposed on a light-receiving surface side of the solid-state imaging device, and unnecessary light enters the pixel region, thereby causing flare.

It is an object of the present disclosure to provide a solid-state imaging device and an electronic apparatus that are capable of suppressing flare.

Solution to Problem

A solid-state imaging device according to the present disclosure includes: (a) a substrate on which a plurality of photodiodes has been formed; (b) a groove portion provided on a side of a light-receiving surface of the substrate; and (c) recessed and projecting portions provided inside the groove portion.

Further, a solid-state imaging device according to the present disclosure includes: (a) a substrate on which a plurality of photoelectric conversion units has been formed; and (b) a groove portion provided on a side of light-receiving surface of the substrate, in which (c) a side wall surface of the groove portion has a shape protruding inward in a width direction of the groove portion toward a side of a bottom surface.

Further, a solid-state imaging device according to the present disclosure includes: (a) a substrate on which a plurality of photoelectric conversion units has been formed; and (b) a groove portion provided on a side of a light-receiving surface of the substrate; in which (c) a side wall surface of the groove portion has a shape protruding inward in a width direction of the groove portion toward a side of an opening.

Further, a solid-state imaging device according to the present disclosure includes: (a) a substrate on which a plurality of photoelectric conversion units has been formed; and (b) a groove portion provided on a side of a light-receiving surface of the substrate, in which (c) a cross-sectional shape of a side wall surface of the groove portion is an arc shape protruding outward or inward in a width direction of the groove portion.

Further, a solid-state imaging device according to the present disclosure includes: (a) a substrate on which a plurality of photoelectric conversion units has been formed; and (b) a groove portion provided on a side of a light-receiving surface of the substrate, in which (c) a bottom surface of the groove portion has a shape in which a plurality of cone-shaped solids is arranged in array.

Further, a solid-state imaging device according to the present disclosure includes: (a) a substrate on which a plurality of photoelectric conversion units has been formed; and (b) a groove portion provided on a side of a light-receiving surface of the substrate, in which (c) a part or all of the groove portion is filled to an opening with a material different from that of the substrate.

Further, a solid-state imaging device according to the present disclosure includes: (a) a substrate on which a plurality of photoelectric conversion units has been formed; and (b) a groove portion provided on a side of a light-receiving surface of the substrate, in which (c) a width of the groove portion varies from one place to another in a longitudinal direction of the groove portion so that reflected light obtained by reflecting incident light from a side of a light-receiving surface of the substrate by the groove portion is directed in a direction different from a direction in which the incident light has entered.

Further, a solid-state imaging device according to the present disclosure includes: (a) a substrate on which a plurality of photoelectric conversion units has been formed; and (b) a groove portion provided on a side of a light-receiving surface of the substrate, in which (c) a distance between a pixel region including a plurality of photoelectric conversion units and the groove portion varies from one place to another in a longitudinal direction of the groove portion so that reflected light obtained by reflecting incident light from a side of a light-receiving surface of the substrate by the groove portion is directed in a direction different from a direction in which the incident light has entered.

Further, an electronic apparatus according to the present disclosure includes: (a) a solid-state imaging device that includes a substrate on which a plurality of photodiodes has been formed, a groove portion provided on a side of a light-receiving surface of the substrate, and recessed and projecting portions provided inside the groove portion; (b) an optical lens that forms an image of image light from a subject onto an imaging surface of the solid-state imaging device; and (c) a signal processing circuit that performs signal processing on a signal output from the solid-state imaging device.

BRIEF DESCRIPTION OF DRAWINGS

FIG. 9 is a diagram for describing a method of calculating a pitch of recessed and projecting portions or the like.

MODE(S) FOR CARRYING OUT THE INVENTION

Hereinafter, an example of a solid-state imaging device and an electronic apparatus according to an embodiment of the present disclosure will be described with reference to FIGS. 1, 2, 3A, 3B, 4A, 4B, 5, 6, 7A, 7B, 8, 9, 10, 11A, 11B, 12, 13, 14, 15, 16A, 16B, 16C, 16D, 16E, 17, 18A, 18B, 18C, 18D, 19A, 19B, 20, 21, 22, 23, 24, 25, 26, 27, 28, 29, 30A, 30B, 31A, 31B, and 32. The embodiment of the present disclosure will be described in the following order. Note that the present disclosure is not limited to the following examples. Further, the effects described herein are merely examples and are not limited, and additional effects may be exerted.

1. First embodiment: solid-state imaging device
1-1 Configuration of entire solid-state imaging device
1-2 Configuration of main parts
1-3 Example
1-4 Modified example
2. Second embodiment: electronic apparatus

1. First Embodiment

1-1 Configuration of Entire Solid-State Imaging Device

The solid-state imaging device according to the first embodiment of the present disclosure will be described.

Figure 1:
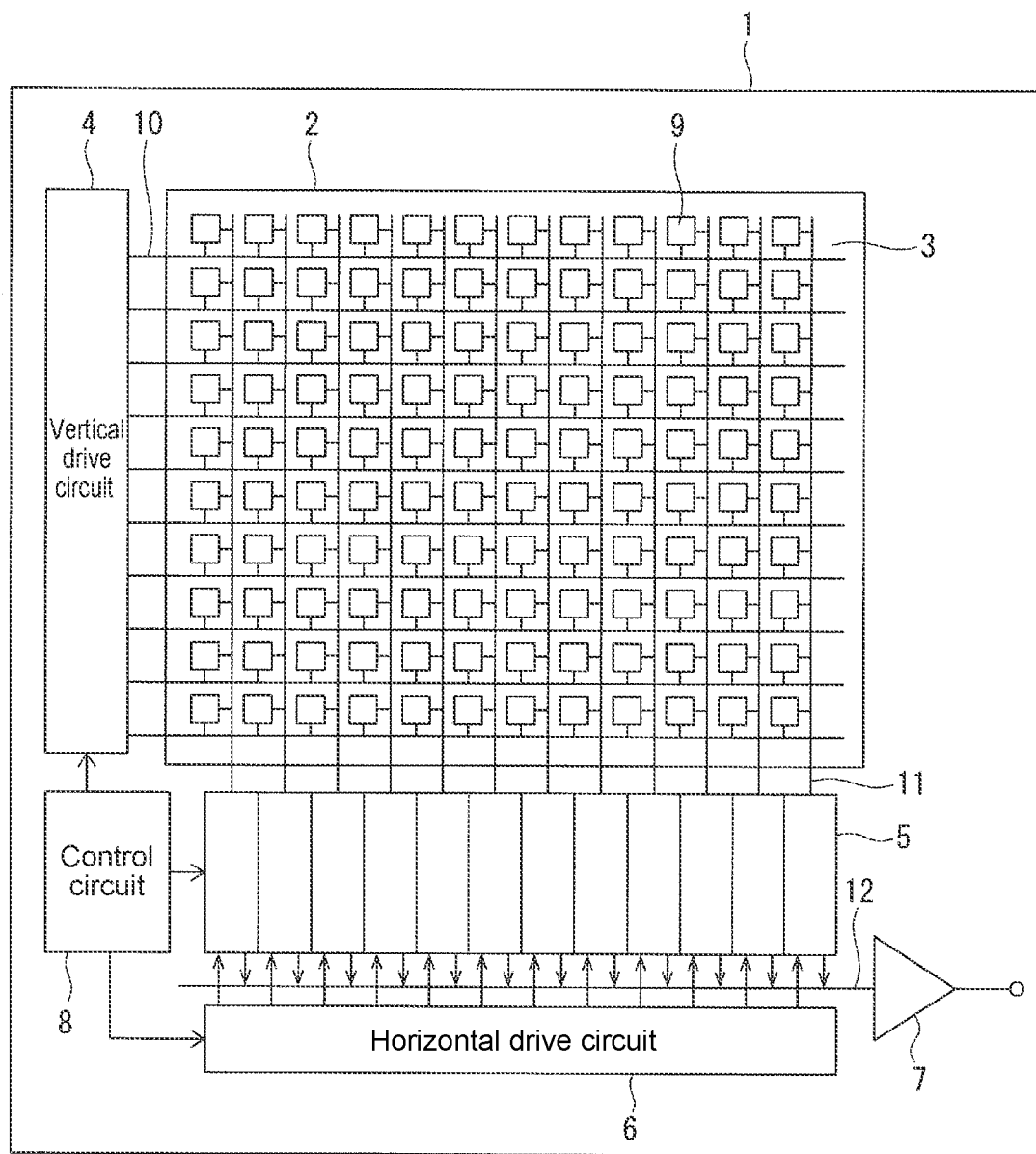
FIG. 1 is a diagram showing a configuration of an entire solid-state imaging device according to a first embodiment of the present disclosure.

FIG. 1 is a schematic configuration diagram showing the entire solid-state imaging device according to the first embodiment of the present disclosure.

Figure 32:
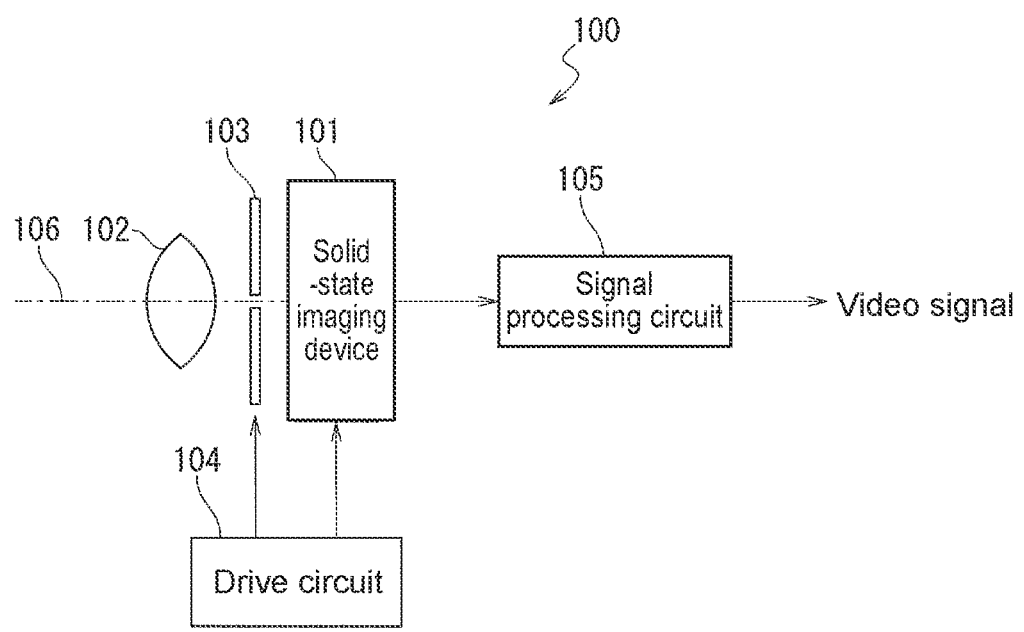
FIG. 32 is a schematic configuration diagram of an electronic apparatus according to a second embodiment of the present disclosure.

A solid-state imaging device 1 in FIG. 1 is a back surface illumination CMOS (Complementary Metal Oxide Semiconductor) image sensor. As shown in FIG. 32, the solid-state imaging device 1 (101) takes in image light (incident light 106) from a subject via an optical lens 102, converts the light amount of the incident light 106 imaged on the imaging surface into an electrical signal in pixel units, and outputs it as a pixel signal.

As shown in FIG. 1, the solid-state imaging device 1 according to the first embodiment includes a substrate 2, a pixel region 3, a vertical drive circuit 4, a column signal processing circuit 5, a horizontal drive circuit 6, an output circuit 7, and a control circuit 8.

The pixel region 3 includes a plurality of pixels 9 regularly arranged in a two-dimensional array on the substrate 2. The pixel 9 includes a photoelectric conversion unit 24 shown in FIG. 3B, and a plurality of pixel transistors (not shown). As the plurality of pixel transistors, for example, four transistors, i.e., a transfer transistor, a reset transistor, a selection transistor, and an amplifier transistor, can be employed. Further, for example, three transistors excluding the selection transistor may be employed.

The vertical drive circuit 4 includes, for example, a shift register, selects a desired pixel drive wiring 10, and supplies a pulse for driving the pixel 9 to the selected pixel drive wiring 10 to drive the respective pixels 9 on a row-by-row basis. That is, the vertical drive circuit 4 selectively scans each of the pixels 9 of the pixel region 3 on a row-by-row basis in the vertical direction sequentially, and supplies a pixel signal based on the signal charges generated in accordance with the amount of received light in the photoelectric conversion unit 24 of each of the pixels 9 to the column signal processing circuit 5 via a vertical signal line 11.

The column signal processing circuit 5 is disposed, for example, for each column of the pixels 9, and performs signal processing such as noise removal on a signal output from the pixels 9 in one row for each pixel column. For example, the column signal processing circuit 5 performs signal processing such as CDS (Correlated Double Sampling) for removing fixed pattern noise unique to the pixel and AD (Analog Digital) conversion.

The horizontal drive circuit 6 includes, for example, a shift register, sequentially outputs a horizontal scan pulse to the column signal processing circuit 5 to select each of the column signal processing circuits 5 in order, and causes each of the column signal processing circuits 5 to output a pixel signal on which signal processing has been performed to a horizontal signal line 12.

The output circuit 7 performs signal processing on a pixel signal sequentially supplied from each of the column signal processing circuits 5 via the horizontal signal line 12 and outputs the obtained pixel signal. As the signal processing, for example, buffing, black level adjustment, column variation correction, or various digital signal processing can be used.

The control circuit 8 generates clock signals and control signals that serve as a reference for operations of the vertical drive circuit 4, the column signal processing circuit 5, the horizontal drive circuit 6, and the like on the basis of a vertical synchronization signal, a horizontal synchronization signal, and a master clock signal. Then, the control circuit 8 outputs the generated clock signals and control signals to the vertical drive circuit 4, the column signal processing circuit 5, the horizontal drive circuit 6, and the like.

1-2 Configuration of Main Parts

Figure 2:
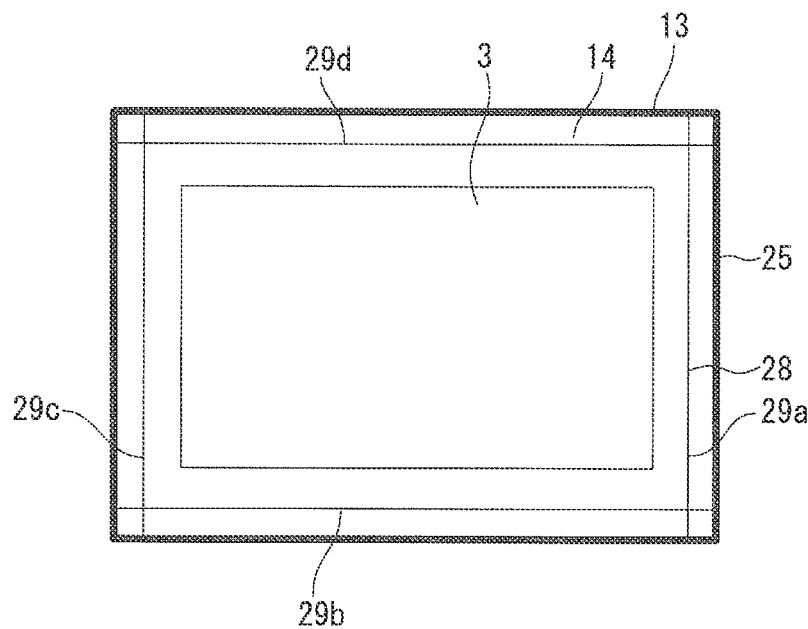
FIG. 2 is a diagram showing a planar configuration of a chip in which the solid-state imaging device has been formed.
Figure 3A:
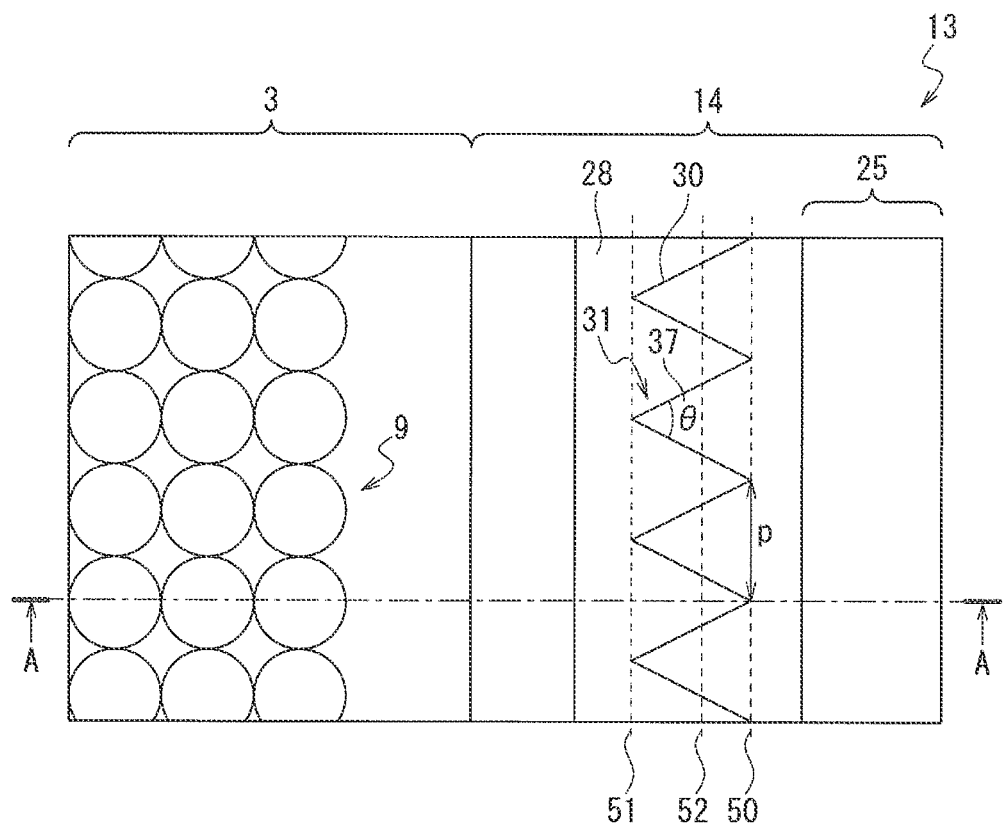
FIG. 3A is an enlarged view of a right end portion of FIG. 2 to show a planar configuration of the chip.

Next, a detailed structure of a chip 13 in which the solid-state imaging device 1 in FIG. 1 is formed will be described. FIG. 2 is a diagram showing a planar configuration of the pixel region 3 and a surrounding region thereof (hereinafter, referred to also as the "surrounding region 14") in the chip 13 where the solid-state imaging device 1 according to the first embodiment is formed. Further, FIG. 3A is an enlarged view of the right end portion of FIG. 2 to show the planar configuration of the chip 13. Further, FIG. 3B is a diagram showing a cross-sectional configuration of the chip 13, which is taken along the line A-A in FIG. 3A.

Figure 3B:
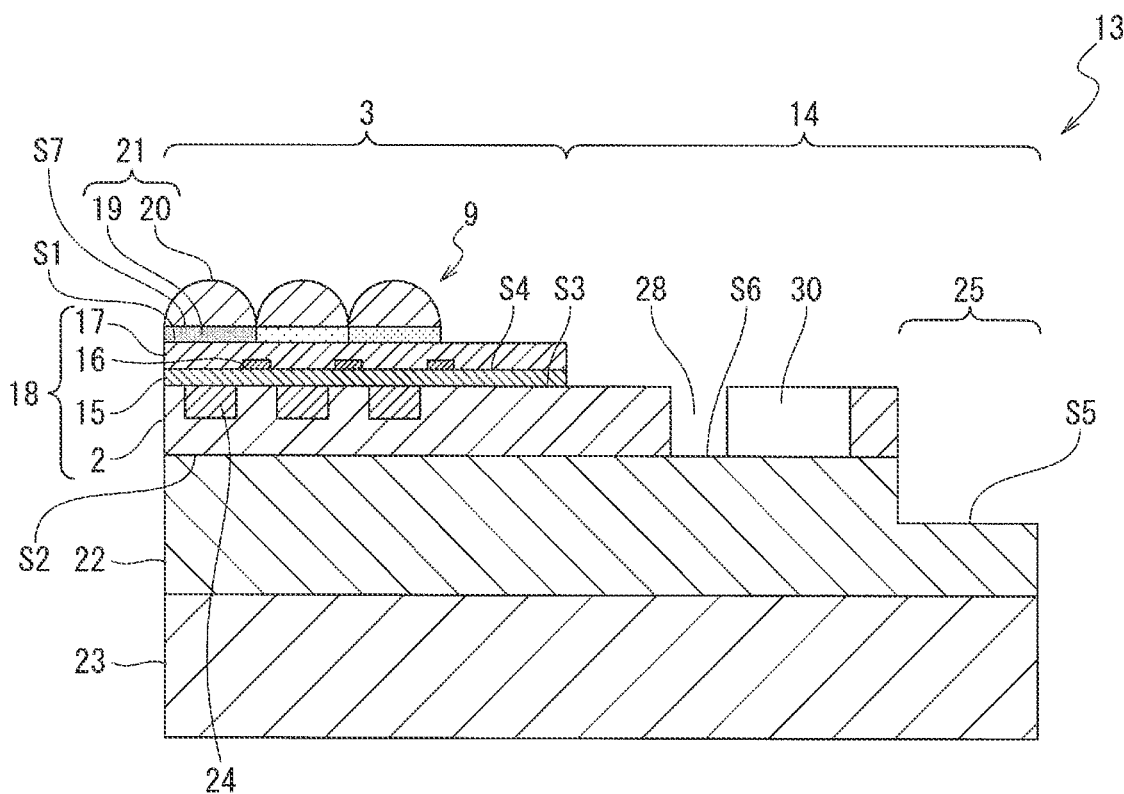
FIG. 3B is a diagram showing a cross-sectional configuration of the chip, which is taken along the line A-A of FIG. 3A.

As shown in FIG. 3B, the chip 13 in which the solid-state imaging device 1 according to the first embodiment is formed includes a light receiving layer 18 obtained by stacking the substrate 2, a protective film 15, a light-shielding film 16, and a flattening film 17 in the stated order. Further, a light collection layer 21 obtained by stacking a color filter layer 19 and an on-chip lens 20 in the stated order is formed on a surface of the light receiving layer 18 on the side of the flattening film 17 (hereinafter, referred to also as the "back surface S1 side"). Further, a wiring layer 22 and a support substrate 23 are stacked on a surface of the light receiving layer 18 on the side of the substrate 2 (hereinafter, referred to also as the "front surface S2 side") in the stated order. Note that since the back surface S1 of the light receiving layer 18 and the back surface of the flattening film 17 are the same surface, also the back surface of the flattening film 17 will be referred to as the "back surface S1" in the following description. Further, the front surface S2 of the light receiving layer 18 and the front surface of the substrate 2 are the same surface, also the front surface of the substrate 2 will be referred to as the "front surface S2" in the following description.

The substrate 2 includes a semiconductor substrate formed of, for example, silicon (Si), and forms the pixel region 3 and the surrounding region 14. In the pixel region 3, as shown in FIG. 3B, the plurality of photoelectric conversion units 24 formed on the substrate 2, i.e., the plurality of pixels 9 including the plurality of photoelectric conversion units 24 embedded in the substrate 2, is arranged in a two-dimensional array. In the photoelectric conversion unit 24, signal charges corresponding to the amount of incident light are generated, and the generated signal charges are accumulated.

The protective film 15 continuously covers the entire back surface S3 side of the substrate 2 (the entire light-receiving surface side). As the material of the protective film 15, for example, a silicon oxide ($SiO_2$) can be used. Further, the light-shielding film 16 is formed in a lattice-like shape that opens the light-receiving surface side of each of the plurality of photoelectric conversion units 24 in a part of a back surface S4 side of the protective film 15 so that the light does not leak into the adjacent pixel 9. Further, the flattening film 17 continuously covers the entire back surface S4 side (the entire light-receiving surface side) of the protective film 15 including the light-shielding film 16 so that the back surface S1 of the light receiving layer 18 is a flat surface without irregularities.

The color filter layer 19 includes a plurality of color filters such as R (red), G (green), and B (blue) for each of the pixels 9 on the back surface S1 side (light-receiving surface side) of the flattening film 17. The colors of each color filter are ordered in accordance with, for example, the Bayer array. The color filter layer 19 causes light of particular wavelengths to be transmitted therethrough, and causes the transmitted light to enter the photoelectric conversion unit 24 within the substrate 2.

The on-chip lens 20 is formed on a back surface S7 side (light-receiving surface side) of the color filter layer 19 corresponding to the pixel 9. The on-chip lens 20 collects the applied light, and causes the collected light to efficiently enter the photoelectric conversion unit 24 in the substrate 2 via the color filter layer 19.

The wiring layer 22 is formed on the front surface S2 side of the substrate 2, and includes a wiring (not shown) stacked in a plurality of layers (three layers in FIG. 3B) via an interlayer insulating film (not shown). The pixel transistor constituting the corresponding pixel 9 is driven via the wiring of a plurality of layers formed in the wiring layer 22. As the material of the wiring layer 22, for example, a silicon oxide ($SiO_2$) can be used.

The support substrate 23 is formed on a surface of the wiring layer 22 opposite to the side facing the substrate 2. The support substrate 23 is a substrate for ensuring the intensity of the substrate 2 in the production stage of the solid-state imaging device 1. For example, silicon (Si) can be used as the material of the support substrate 23.

In the chip 13 where the solid-state imaging device 1 having the above-mentioned configuration is formed, light is applied from the back surface side of the substrate 2 (the back surface S1 side of the light receiving layer 18), the applied light is transmitted through the on-chip lens 20 and the color filter layer 19, and the transmitted light is photoelectrically converted by the photoelectric conversion unit 24, whereby signal charges are generated. Then, the generated signal charges are output as a pixel signal by the vertical signal line 11 shown in FIG. 1 via the pixel transistor formed on a front surface S2 side of the substrate 2.

Figure 4A:
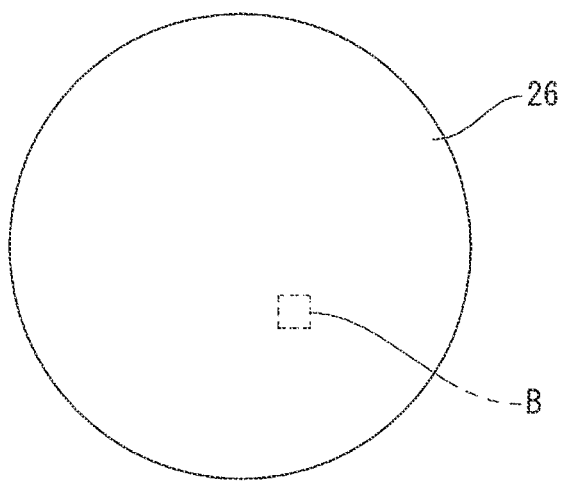
FIG. 4A is a diagram showing a planar configuration of a wafer.
Figure 4B:
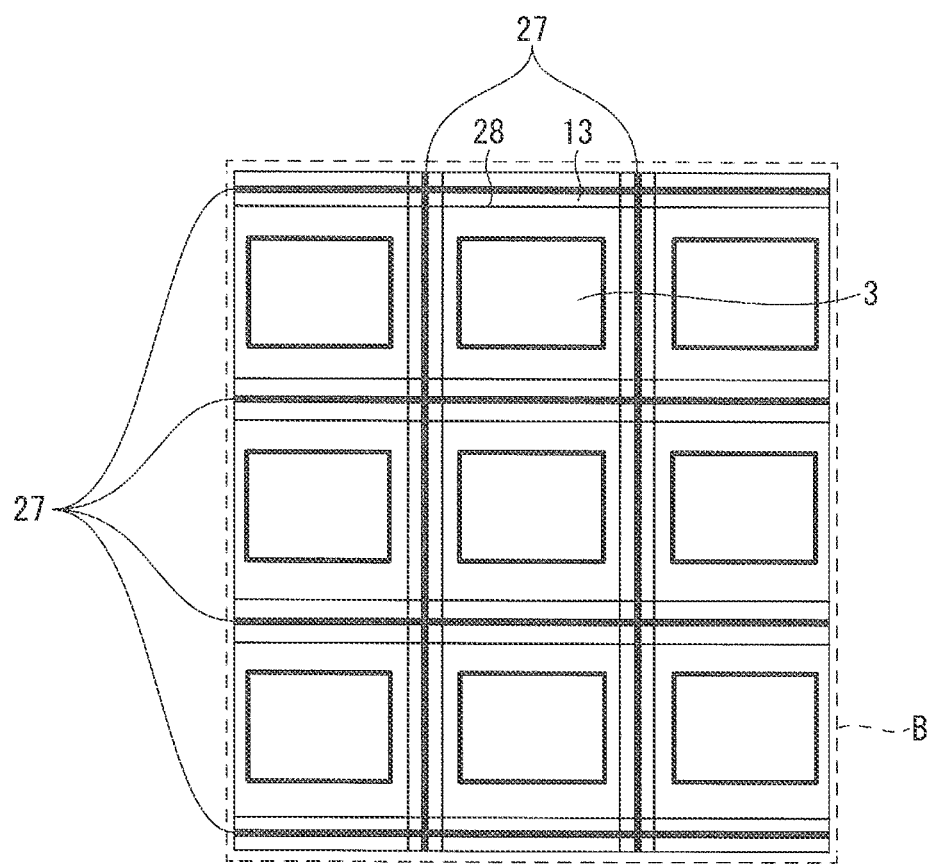
FIG. 4B is an enlarged view of a B region of FIG. 4A to show the planar configuration of the wafer.

Further, as shown in FIG. 2, FIG. 3A, and FIG. 3B, a split scribe region 25 formed along the outer periphery of the pixel region 3 is provided on the outer periphery side of the surrounding region 14. As shown in FIG. 4A and FIG. 4B, the split scribe region 25 is a region obtained by dicing (splitting) a bottom surface of a groove-shaped scribe region 27 formed from the back surface S3 side of the substrate 2 toward the depth direction (hereinafter, referred to as the "pre-split scribe region 27") between the respective chips 13 formed on a wafer 26 by a blade (not shown). The width of the pre-split scribe region 27 is made greater than the width of the blade. As a result, it is possible to prevent the blade from contacting the substrate 2 during dicing of the chip 13, prevent distortion from occurring, and prevent peeling of the substrate 2 or cracking from occurring. Therefore, it is possible to prevent the intrusion of water due to peeling or the like, prevent the occurrence of condensation, and prevent image quality deterioration. A bottom surface S5 of the split scribe region 25 is formed inside the wiring layer 22.

Further, as shown in FIG. 2, FIG. 3A, and FIG. 3B, a groove portion 28 formed from the back surface S3 side of the substrate 2 toward the depth direction along the outer periphery of the pixel region 3 and the inner periphery of the split scribe region 25 is provided on the inner peripheral side of the surrounding region 14. That is, the groove portion 28 includes four straight grooves 29a, 29b, 29c, and 29d surrounding the pixel region 3 between the split scribe region 25 and the pixel region 3. A bottom surface S6 of the groove portion 28 is formed on a surface of the wiring layer 22 on the light-receiving surface side.

As described above, in the solid-state imaging device 1 according to the first embodiment, by providing the pre-split scribe region 27, a structure in which distortion is hardly generated in the substrate 2 and peeling or cracking of the substrate 2 is hardly generated is achieved. However, even in such a structure, there is a possibility that the blade is in contact with the substrate 2, and peeling or cracking of the substrate 2 occurs. In this regard, by providing also the groove portion 28, even if peeling or cracking occurs, the peeling or cracking can be prevented from proceeding into the pixel region 3.

Figure 5:
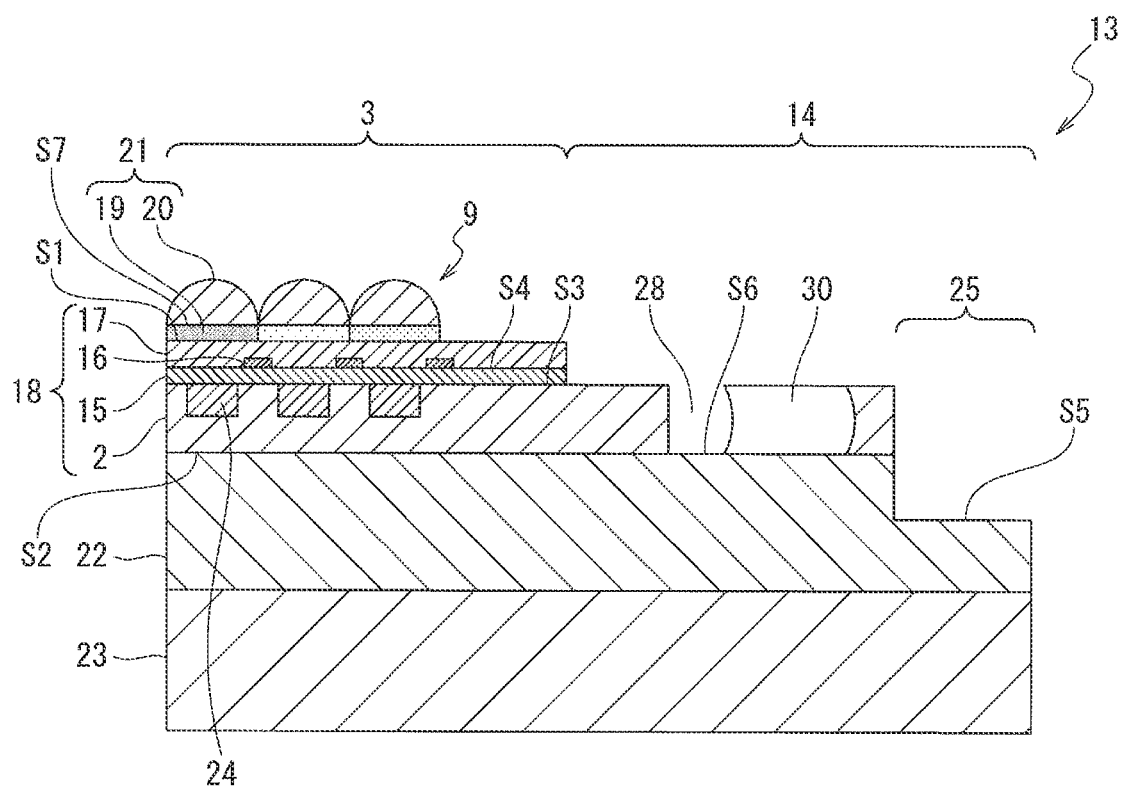
FIG. 5 is a diagram showing a cross-sectional configuration of a chip according to a modified example.
Figure 6:
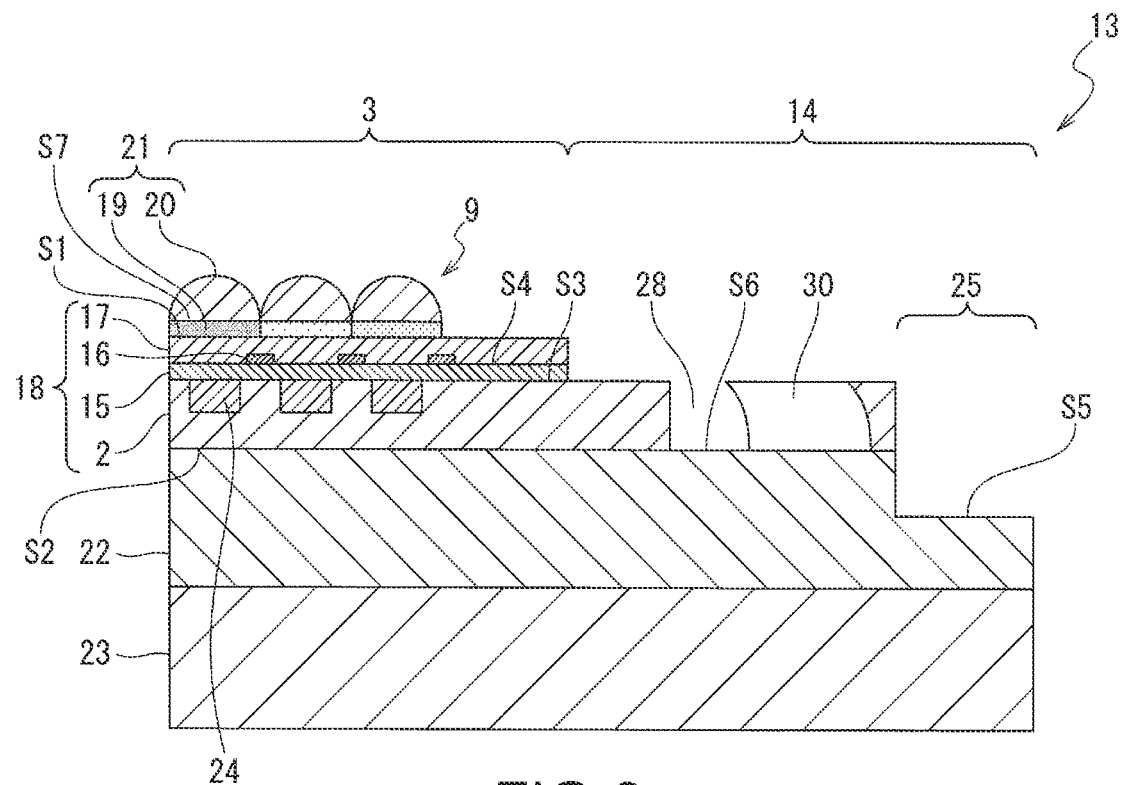
FIG. 6 is a diagram showing the cross-sectional configuration of the chip according to the modified example.

A plurality of recessed and projecting portions 31 is formed on a side wall surface 30 facing the photoelectric conversion unit 24 side, of side wall surfaces of the groove portion 28. As the recessed and projecting portions 31, for example, a shape that scatters incident light from the back surface S1 side of the substrate 2 can be used. For example, as shown in FIG. 3A, as the shape of the recessed and projecting portions 31, a saw blade shape in which triangles are consecutive as viewed from the back surface S1 side of the substrate 2 can be employed. Further, for example, as shown in FIG. 3B, a straight line extending in a direction perpendicular to the back surface S1 of the substrate 2 as viewed from the side of the substrate 2 can be employed. Note that as shown in FIG. 5 and FIG. 6, a shape unintentionally curved in the production process or a shape artificially curved can be employed. FIG. 5 illustrates an example in which the entire side wall surface 30 is curved. FIG. 6 illustrates an example in which only the protective film 15 side of the side wall surface 30 has a curve shape.

As described above, in the solid-state imaging device 1 according to the first embodiment, by providing the groove portion 28, a structure in which peeling or cracking hardly progresses into the pixel region 3 is achieved. However, if such a structure is used, flare occurs in the case where a camera module 32 is configured as shown in the FIG. 7A. That is, in the case where the camera module 32 in which a cover glass 33 is placed on the solid-state imaging device 1 and imaging lenses 34a, 34b, 34c, 34d, and 34e are disposed thereon is configured, when an incident light 35 enters the groove portion 28 via the imaging lenses 34a to 34e and the cover glass 33, there is a possibility that the incident light 35 is reflected by the side wall surface 30 or the bottom surface S6 of the groove portion 28 and travels to the pixel region 3 as shown in FIG. 7B, the incident light 35 is reflected by the cover glass 33, the imaging lenses 34a to 34e, or the like, and the reflected incident light 35 enters the pixel region 3 and causes flare. Therefore, by providing the recessed and projecting portions 31 on the side wall surface 30 of the groove portion 28, even if the incident light 35 enters the groove portion 28, the entered incident light 35 is diffused by the recessed and projecting portions 31 or reflected a plurality of times in the recessed and projecting portions 31 and attenuated as shown in FIG. 8, and thus, flare can be suppressed.

Note that in the solid-state imaging device 1 according to the first embodiment, as shown in FIG. 3A, the recessed and projecting portions 31 can be described as including a projecting portion 37 having, as a reference surface 50, a surface that is parallel to a side surface of the chip 13 and passes through the bottom portion of the recessed and projecting portions 31. However, in the case where a surface that is parallel to the side surface of the chip 13 and passes through the apex of the recessed and projecting portions 31 is used as a reference surface 51, the recessed and projecting portions 31 can be described as including a plurality of recessed portions. Further, in the case where the surface positioned between the reference surface 50 and the reference surface 51 is used as a reference surface 52, the recessed and projecting portions 31 can be described as including a plurality of recessed portions and projecting portions. These are essentially the same, with different perspectives for description only.

Figure 9:
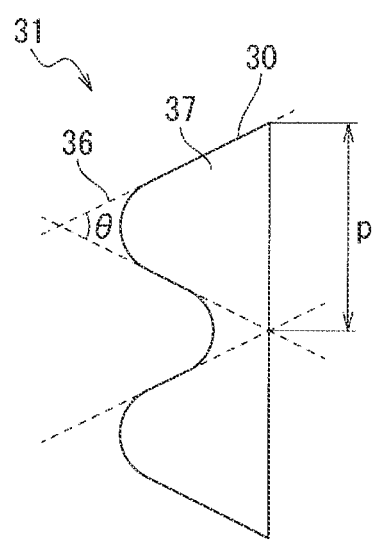

Further, a pitch p of irregularities of the recessed and projecting portions 31 is favorably, for example, 0.1 um or more and less than 100 um. As the pitch p of the irregularities of the recessed and projecting portions 31, as shown in FIG. 3A, for example, the distance between bottom portions of the adjacent recessed portions formed between the consecutive projecting portions 37, 37, and 37 in plan view can be used. Further, for example, the distance between apexes of the adjacent projecting portions 37 and 37 in plan view can be used. There is no essential difference between these two. Note that as shown in FIG. 9, in the case where the recessed and projecting portions 31 have corners rounded in the production process or artificially rounded corners, the pitch p only needs to be defined by drawing a tangent 36 on the recessed and projecting portions 31.

In the case where the pitch of the irregularities of the recessed and projecting portions 31 is less than 0.1 μm, it is difficult to process the recessed and projecting portions 31, so that the shape of the recessed and projecting portions 31 is not the target one. Meanwhile, in the case where the pitch of the irregularities is 100 μm or more, it is disadvantageous in terms of costs. That is, when the pitch of the irregularities is 100 μm and the angle θ of the apex of the projecting portion 37 of the recessed and projecting portions 31 is 1° (the lower limit value of a range of 1° to 80° of a suitable angle θ to be described below), since the height of the projecting portion 37 is 5.73 mm and the recessed and projecting portions 31 occupy the layout more than the pixel region 3, the number of the chips 13 that can be formed on the wafer 26 is reduced and costs are increased. Further, when the pitch p of the irregularities of the recessed and projecting portions 31 is 100 um and the angle θ of the apex of the projecting portion 37 of the recessed and projecting portions 31 is 80° (the upper limit value of the range of 1° to 80° of the suitable angle θ to be described below), the height of the projecting portion 37 is approximately 60 um, but this degree of occupation of the layout will have a low impact on the number of the chips 13 that can be formed and can be tolerated in terms of costs.

Further, the recessed and projecting portions 31 may be provided in the whole or only a part of each of the straight grooves 29a to 29d. When the recessed and projecting portions 31 are provided in only a part of each of the straight grooves 29a to 29d, it is favorable to provide the recessed and projecting portions 31 in the vicinity of the center of the straight grooves 29a to 29d from the viewpoint that the effect of the flare can be made less noticeable.

Further, it is favorable that each of the straight grooves 29a to 29d includes 20 or more consecutive projecting portions 37 of the recessed and projecting portions 31. That is, in the case where light from a light source or the like forms an image on the groove portion 28 by the on-chip lens 20, the spot diameter of the light to be formed is approximately 2 μm. Therefore, for example, in the case where the pitch p of the irregularities is 0.1 um (the lower limit value of the pitch p), in order to suppress the flare caused by the light being reflected by the side wall surface 30 of the groove portion 28, it is required that at least 20 projecting portions 37 are consecutively provided to make the region where the projecting portions 37 are consecutive larger than the spot diameter.

Figure 10:
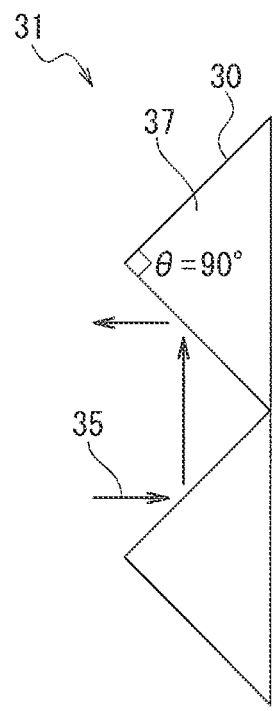
FIG. 10 is a diagram for describing a suitable range of the angle of a projecting portion.

Further, in the case where the recessed and projecting portions 31 having a shape that is a saw blade viewed from the back surface S1 side of the substrate 2 are used, the angle θ of the apex of the projecting portion 37 is favorably 1° or more and less than 80°. In particular, from the viewpoint of diffusing the incident light 35, θ is more favorably 1° or more and 60° or less, and most favorably 30°±10°. Note that as shown in FIG. 9, in the case where the recessed and projecting portions 31 have corners rounded in the production process or artificially rounded corners, the angle θ only needs to be defined by drawing the tangent 36 on the recessed and projecting portions 31. In the case where the angle θ of the apex of the projecting portion 37 is greater than or equal to 80° (e.g., 90°), the incident light 35 to the projecting portion 37 is reflected by the surface of the projecting portion 37 as shown in FIG. 10, and the reflected incident light 35 is reflected by the surface of another adjacent projecting portion 37, so that the traveling direction of the incident light 35 is reversed from that at the time of entering. Therefore, the incident light 35 enters the pixel region 3, and the amount of suppression of flare is reduced. Meanwhile, in the case where the angle θ of the apex of the projecting portion 37 is less than 1°, production is difficult and stable mass production is difficult.

Figure 11A:
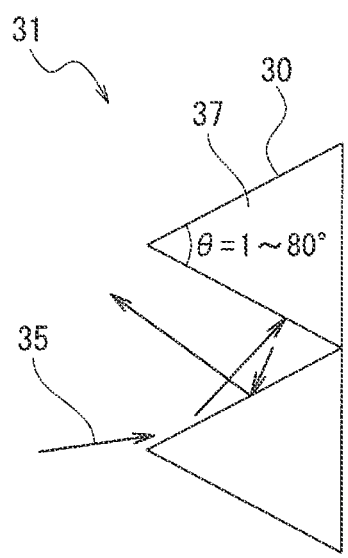
FIG. 11A is a diagram for describing the suitable range of the angle of the projecting portion.
Figure 11B:
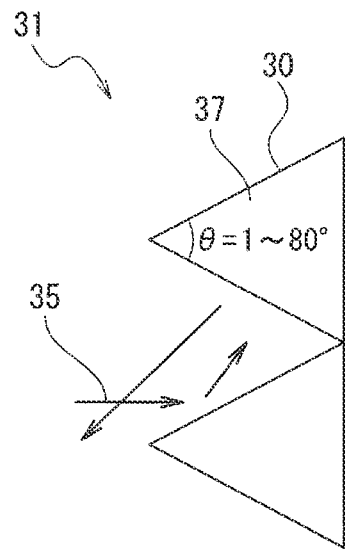
FIG. 11B is a diagram for describing the suitable range of the angle of the projecting portion.

In contrast, as shown in FIGS. 11A and 11B, in the case where the angle θ of the apex of the projecting portion 37 is 1° or more and less than 80°, by reflecting the incident light 35 that has entered the projecting portion 37 in various directions to complicate the traveling direction, the incident light 35 can be scattered and flare can be more appropriately suppressed.

As a method of forming the groove portion 28, for example, a method of selectively etching from the back surface S3 side of the substrate 2 toward the depth side so as to have a rectangular shape surrounding the pixel region 3 of the substrate 2 can be employed. As the etching method, for example, a method of providing, after stacking up to the on-chip lens 20 on the back surface S3 of the pixel region 3 of the substrate 2, a mask having an opening for forming the groove portion 28 and the recessed and projecting portions 31 on the back surface S3, and performing etching via the mask can be employed.

Note that the process of forming the groove portion 28 can be made common with the process of forming the pre-split scribe region 27 or the like. In the case where the processes are made common, the number of processes can be reduced.

As described above, the solid-state imaging device 1 according to the first embodiment includes the substrate 2 on which the plurality of photoelectric conversion units 24 has been formed; the groove portion 28 provided on the side of the light-receiving surface of the substrate 2; and the recessed and projecting portions 31 provided on the side wall surface 30 of the groove portion 28 facing the side of the photoelectric conversion unit 24. Therefore, since the incident light 35 to the side wall surface 30 of the groove portion 28 is diffused or reflected a plurality of times in the recessed and projecting portions 31 and attenuated, it is possible to provide the solid-state imaging device 1 capable of suppressing flare. Further, since the recessed and projecting portions 31 can be formed at the same time as the groove portion 28, no additional man-hours are required, and an inexpensive flare measure can be achieved.

1-3 Example

Figure 12:
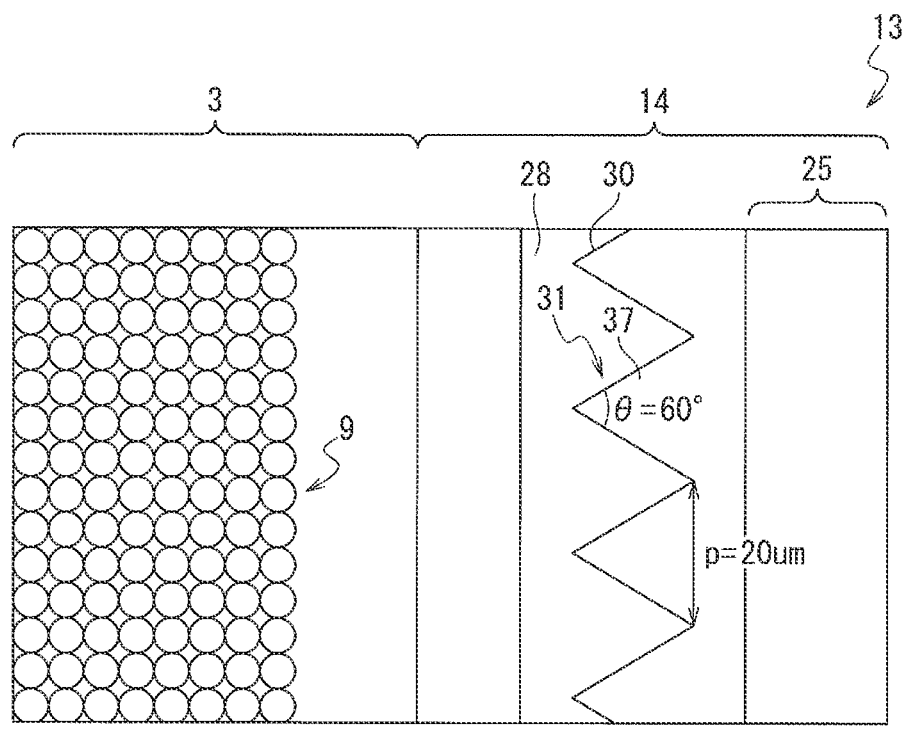
FIG. 12 is a diagram showing a planar configuration of a chip in which a solid-state imaging device according to an Example 1 has been formed.
Figure 13:
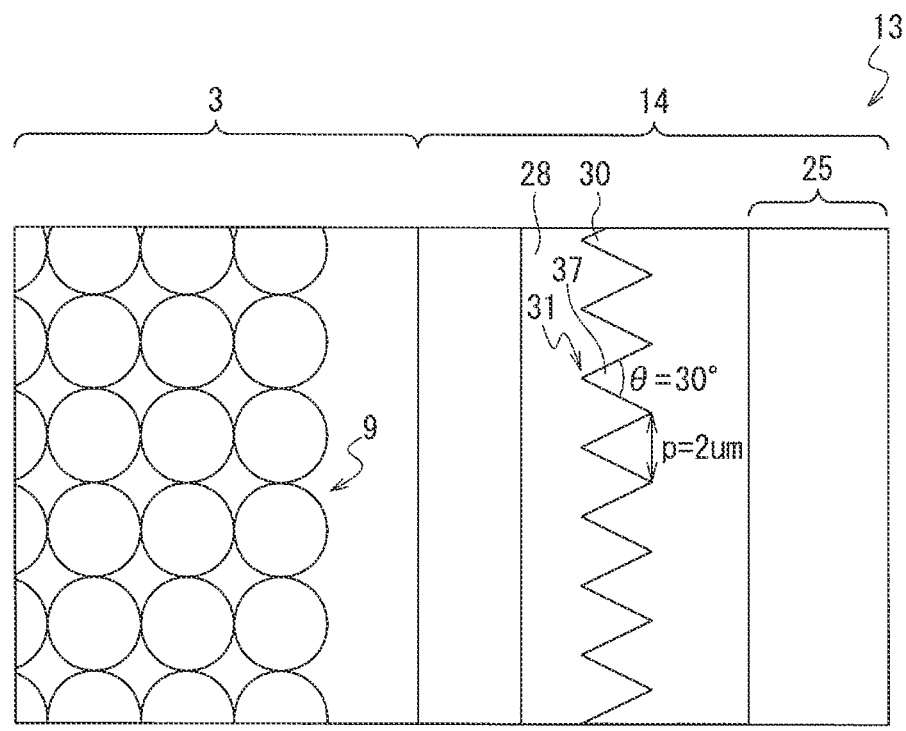
FIG. 13 is a diagram showing a planar configuration of a chip in which a solid-state imaging device according to an Example 2 has been formed.
Figure 14:
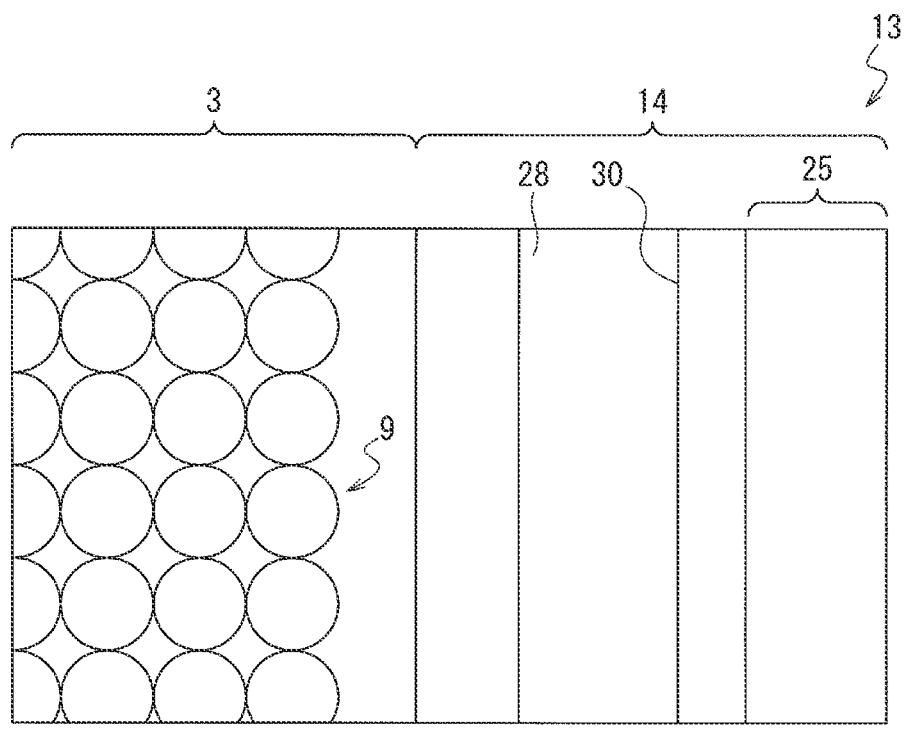
FIG. 14 is a diagram showing a planar configuration of a chip in which a solid-state imaging device according to a Comparative Example 1 has been formed.

Next, Examples of the chip 13 in which the solid-state imaging device 1 in FIG. 1 is formed will be described. FIG. 12, FIG. 13, and FIG. 14 are respectively diagrams showing a cross-sectional configuration of the chip 13 in which the solid-state imaging device 1 according to Example 1, Example 2 and Comparative Example 1 is formed.

Example 1

In Example 1, as shown in FIG. 12, the chip 13 was produced by setting the angle θ of the apex of the projecting portion 37 of the recessed and projecting portions 31 to 60° and the pitch p to 20 μm.

Example 2

In Example 2, as shown in FIG. 13, the chip 13 was produced in the same manner as Example 1 except that the angle θ of the apex of the projecting portion 37 of the recessed and projecting portions 31 was set to 30° and the pitch p was set to 2 um.

Comparative Example 1

In Comparative Example 1, as shown in FIG. 14, the chip 13 was produced in the same manner as Example 1 except that the recessed and projecting portions 31 was omitted and the side wall surface 30 of the groove portion 28 was a flat surface having no irregularities.

Performance Evaluation

Figure 7A:
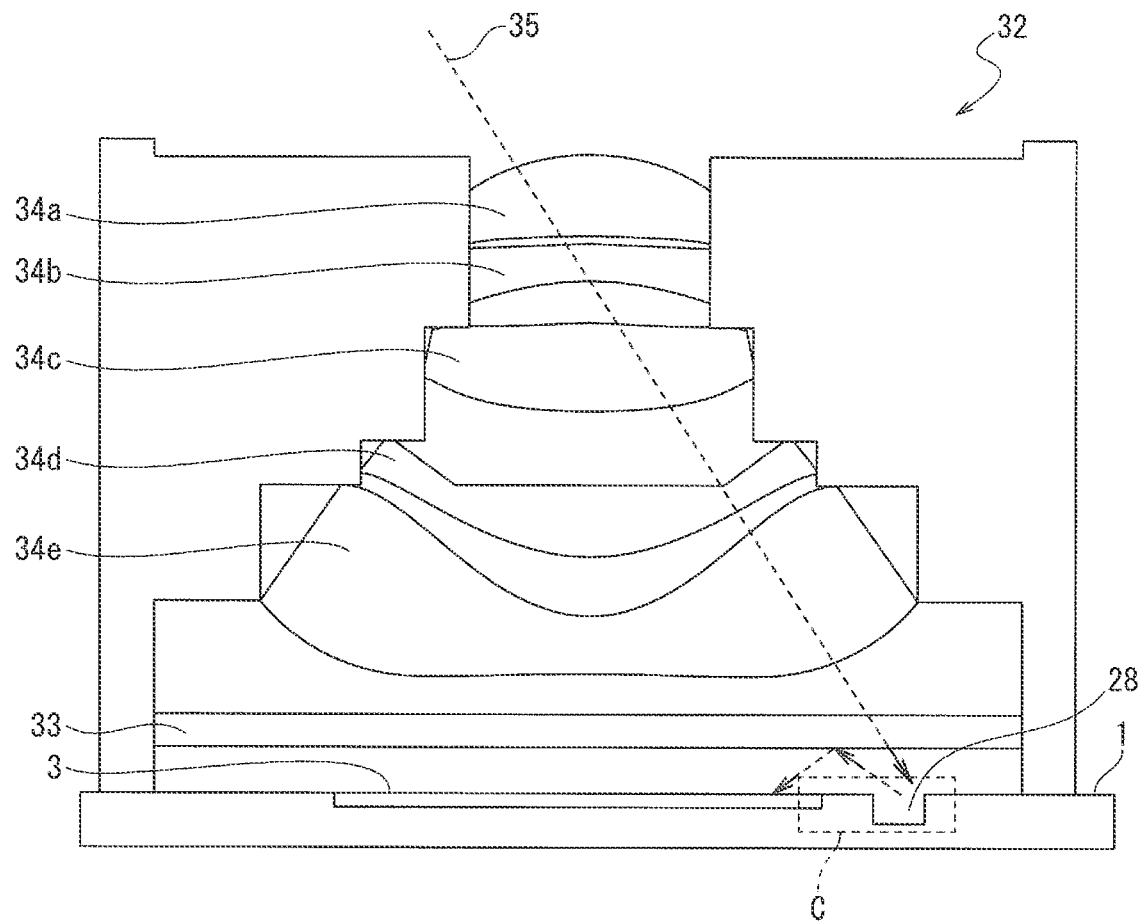
FIG. 7A is a diagram showing a cross-sectional configuration of a camera module.
Figure 7B:
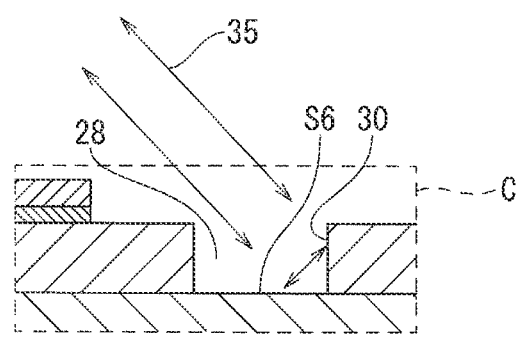
FIG. 7B is an enlarged view of a C region of FIG. 7A to show the cross-sectional configuration of the camera module.
Figure 8:
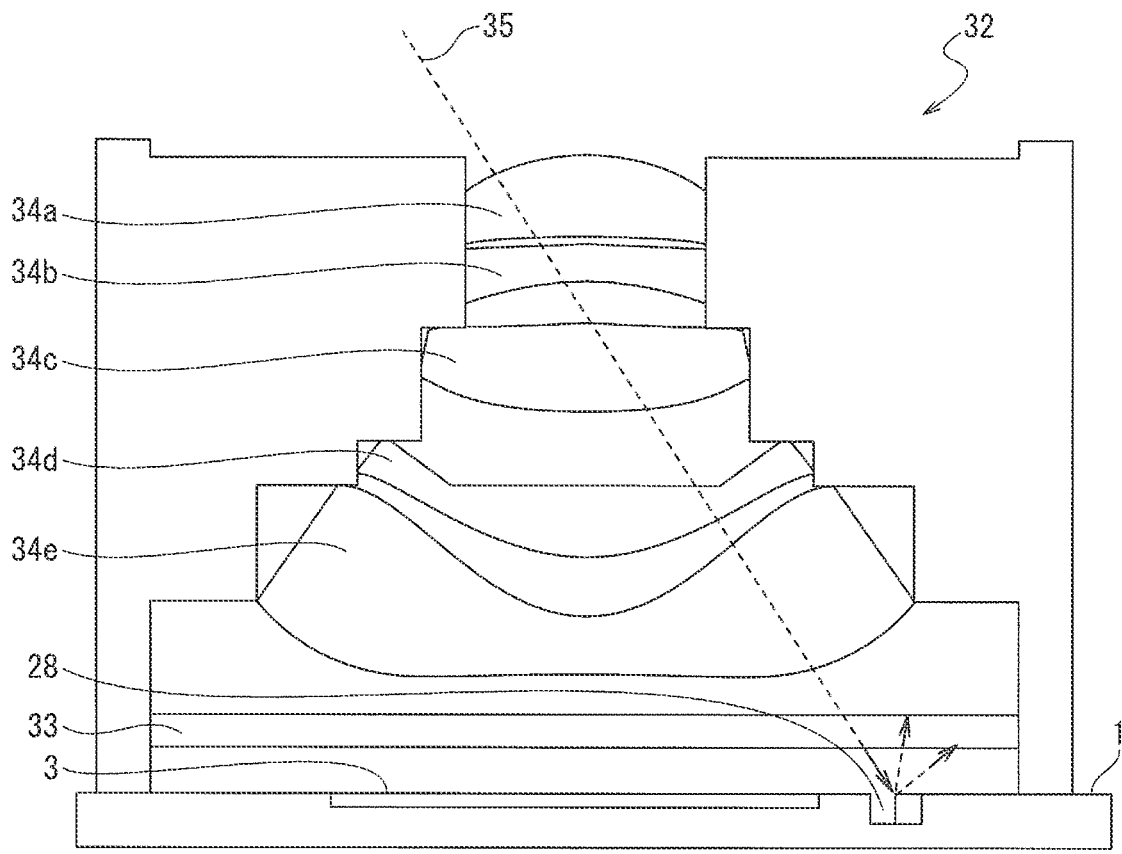
FIG. 8 is a diagram showing the cross-sectional configuration of the camera module.

As shown in FIGS. 7A and 7B, the camera module 32 in which the cover glass 33 was disposed on each of the solid-state imaging devices 1 according to Example 1, Example 2, and Comparative Example 1 and the imaging lenses 34a, 34b, 34c, 34d, and 34e were disposed thereon was configured. Then, the incident light 35 from a light source or the like was applied to the recessed and projecting portions 31 of the groove portion 28 via the imaging lenses 34a to 34e and the cover glass 33.

As a result, in the solid-state imaging devices 1 according to Examples 1 and 2, it was confirmed that the incident light 35 that has entered the recessed and projecting portions 31 shown in FIG. 3A was reflected in various directions, the traveling direction of the incident light 35 was complicated, and the incident light 35 was scattered, thereby making it possible to suppress flare. In particular, it was confirmed by the solid-state imaging device 1 according to Example 2 that since the flare suppressing effect is potentially high when the angle θ of the apex of the projecting portion 37 is small, the increase in the area occupied by the layout can be suppressed by the recessed and projecting portions 31 by reducing the pitch p. Meanwhile, it was confirmed by the solid-state imaging device 1 according to Example 1 that since double reflections between the projecting portions 37 are less likely to occur from the viewpoint of three-dimensional structure by increasing the pitch p as much as possible when the angle θ of the apex of the projecting portion 37 is large, the effect of suppressing flare can be enhanced.

Meanwhile, in the solid-state imaging device 1 according to Comparative Example 1, as shown in FIG. 7A and FIG. 7B, the incident light 35 that had entered the recessed and projecting portions 31 was reflected in the opposite direction, the reflected incident light 35 was reflected by the cover glass 33 or the imaging lenses 34a to 34e, and the incident light 35 entered the pixel region 3 to generate flare.

Figure 15:
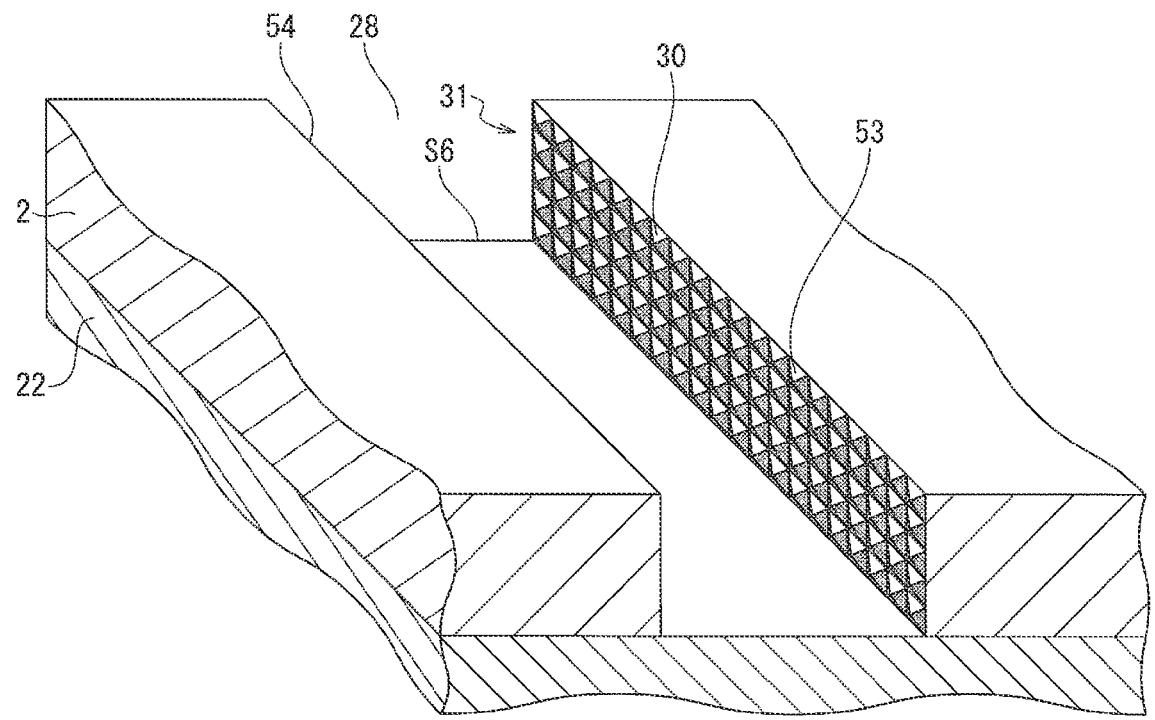
FIG. 15 is a diagram showing a stereoscopic configuration of a groove portion according to a modified example.

1-4 Modified Example (1) Note that an example in which the recessed and projecting portions 31 have a saw blade shape in which triangles are consecutive has been shown in the first embodiment, but other configurations may be employed. For example, as shown in FIG. 15, the recessed and projecting portions 31 may have a shape in which a plurality of cone-shaped solids 53 is arranged in array (hereinafter, referred to also as "moth-eye structure") As the cone-shaped solid 53, for example, a quadrangular pyramid or a cone can be employed. FIG. 15 shows an example in which a quadrangular pyramid is employed as the cone-shaped solid 53. By causing the recessed and projecting portions 31 to have a moth-eye structure, since the refractive index changes gradually from the leading edge of the cone-shaped solid 53 to the root, reflection of the incident light 35 on the side wall surface 30 can be suppressed, and the intensity of the reflected light can be reduced. Note that this modified example is not limited to the configuration shown in FIG. 15. For example, also a side wall surface 54 facing the side wall surface 30, of side wall surfaces of the groove portion 28, may have a moth-eye structure.

Figure 16A:
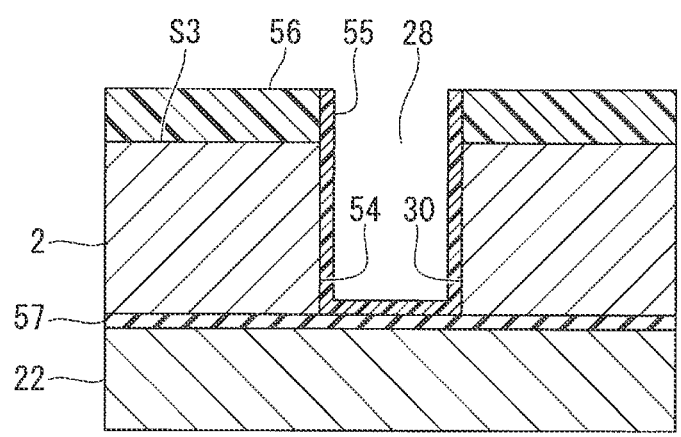
FIG. 16A is a diagram for describing a method of forming a cone-shaped solid.
Figure 16B:
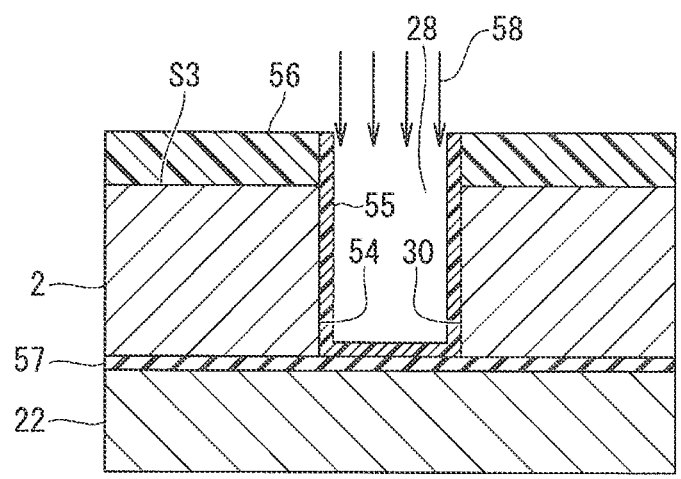
FIG. 16B is a diagram for describing the method of forming the cone-shaped solid.
Figure 16C:
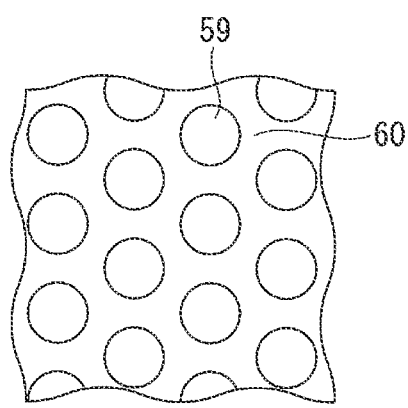
FIG. 16C is a diagram for describing the method of forming the cone-shaped solid.

As a method of forming the cone-shaped solid 53 on the side wall surfaces 30 and 54, for example, a DSA (Direct Self-Assembly) technology can be used. Specifically, as shown in FIG. 16A, first, a deblock copolymer 62 is applied to the two side wall surfaces 30 and 54 and the bottom surface S6 of the groove portion 28. As the deblock copolymer 62, for example, polystyrene-polymethyl methacrylate (PS-PMMA) can be employed. Further, a resist 56 is applied to the back surface S3 of the substrate 2. FIG. 16A shows an example of a silicon nitride film 57 provided at the interface between the substrate 2 and the wiring layer 22. Subsequently, as shown in FIG. 16B, the applied deblock copolymer 62 is irradiated with ultraviolet rays 58. Upon irradiation of the ultraviolet rays 58, the repulsion of polystyrene with polymethyl methacrylate produces a phase-separation structure of from a few nm to several tens of nm as shown in FIG. 16C. FIG. 16C shows an example in which polymethyl methacrylate forms a sphere 59 and polystyrene cross-links to form an etching plate 60.

Figure 16D:
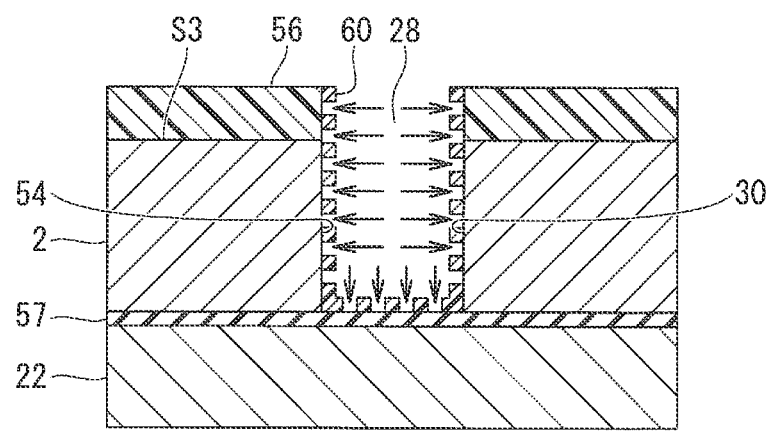
FIG. 16D is a diagram for describing the method of forming the cone-shaped solid.
Figure 16E:
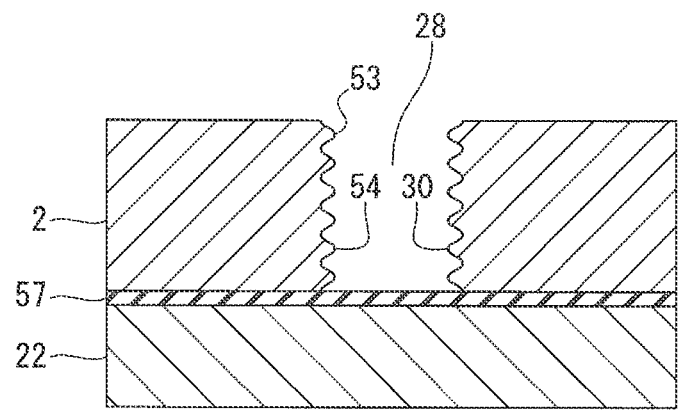
FIG. 16E is a diagram for describing the method of forming the cone-shaped solid.

The shape and pitch of the phase-separation structure are adjusted by the volume ratio of polystyrene to polymethyl methacrylate. Subsequently, as shown in FIG. 16D, by removing the sphere 59 of polymethyl methacrylate and performing isotropic dry etching using the etching plate 60 of polystyrene, the plurality of cone-shaped solids 53 is formed on the side wall surface 30 as shown in FIG. 16E. In FIG. 16E, the etching plate 60 and the resist 56 has been removed.

Figure 17:
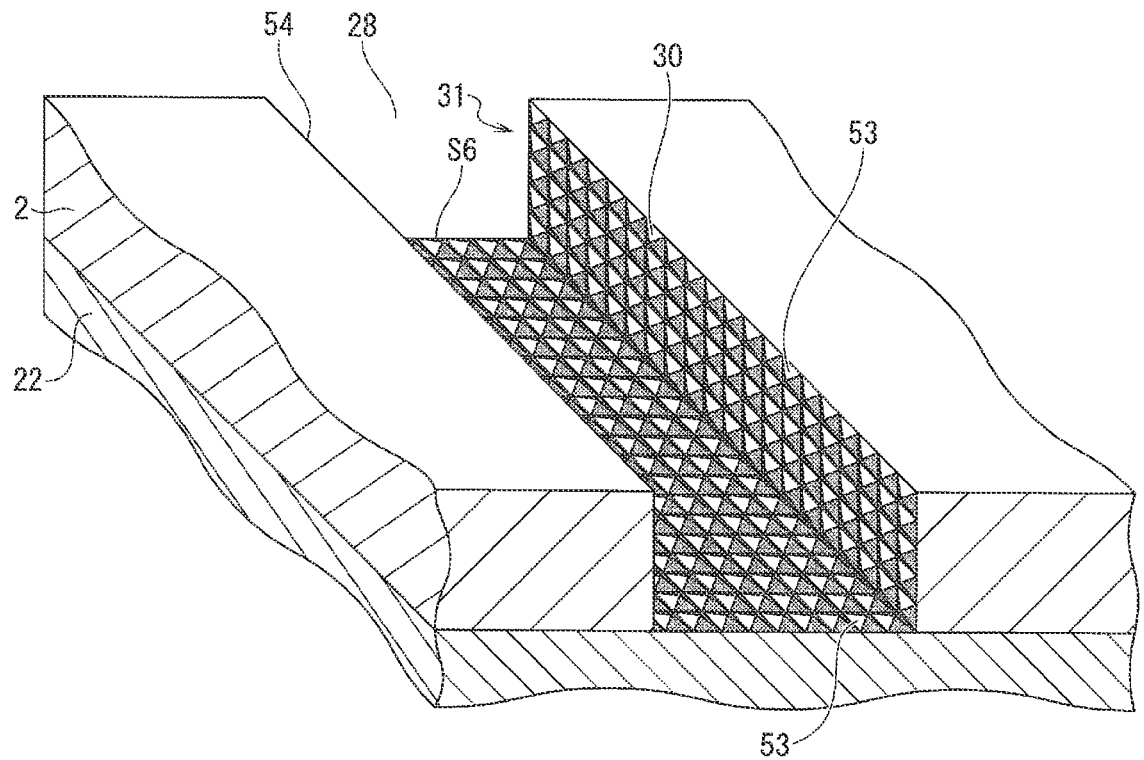
FIG. 17 is a diagram showing the stereoscopic configuration of the groove portion according to the modified example.

(2) Further, for example, as shown in FIG. 17, the bottom surface S6 of the groove portion 28 may have a shape (moth-eye structure) in which the plurality of cone-shaped solids 53 is arranged in array. FIG. 17 shows an example in which each of the side wall surface 30 and the bottom surface S6 of the groove portion 28 has a moth-eye structure. Note that this modified example is not limited to the configuration shown in FIG. 17. For example, the side wall surface 30 of the groove portion 28 does not necessarily need to have the moth-eye structure, and only the bottom surface S6 may have the moth-eye structure. When the bottom surface S6 of the groove portion 28 has a moth-eye structure, the refractive index gradually changes from the leading edge to the root of the cone-shaped solid 53, reflection of the incident light 35 on the bottom surface S6 can be suppressed, and the intensity of the reflected light can be reduced.

Figure 18A:
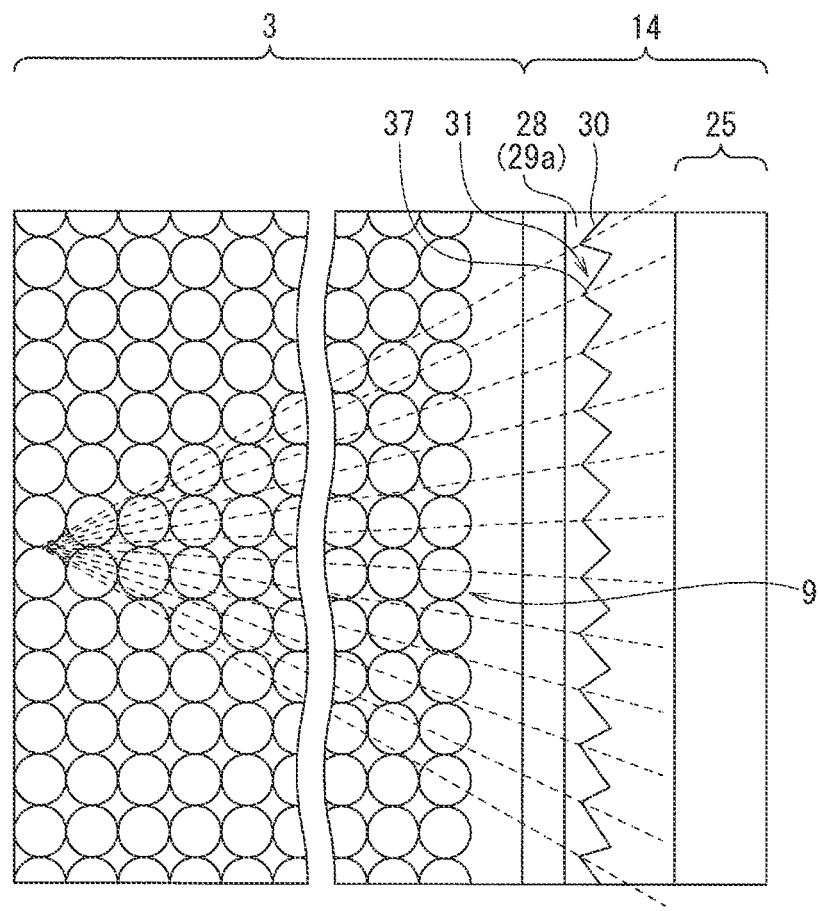
FIG. 18A is a diagram showing a planar configuration of a chip according to a modified example.
Figure 18B:
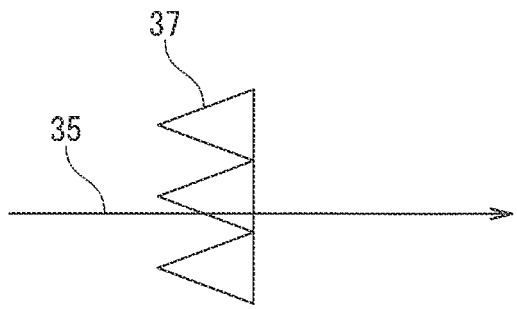
FIG. 18B is a diagram for describing a suitable shape of the projecting portion.

(3) Further, an example in which the shape of the recessed and projecting portions 31 is a shape in which the same triangles repeatedly appear has been shown in the first embodiment, but other configurations can be employed. For example, the shape of the recessed and projecting portions 31, i.e., the triangular shape, may be different from one place to another in the longitudinal direction of the groove portion 28. Specifically, as shown in FIGS. 18A and 18B, the projecting portion 37 having an isosceles triangle shape was provided on the side wall surface 30 on the side of the central part of the pixel region 3, of the four straight grooves 29a, 29b, 29c, and 29d surrounding the pixel region 3. By using such a triangular shape, it is possible to increase the number of reflections of the incident light 35 in the vicinity of the center in the longitudinal direction of the straight grooves 29a, 29b, 29c and 29d, and disperse the optical path of the reflected the incident light 35 as compared with the case where there is no projecting portion 37 at all. The dotted lines in FIG. 18A represent the optical path of the incident light 35 entering the apex of the projecting portion 37.

Figure 18C:
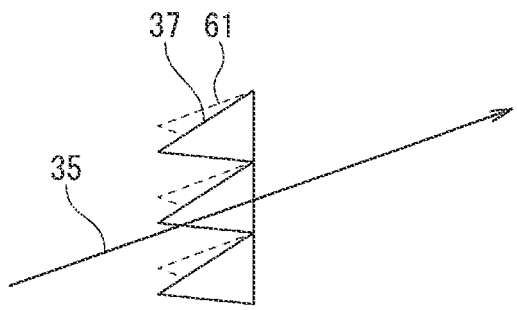
FIG. 18C is a diagram for describing a suitable shape of the projecting portion.
Figure 18D:
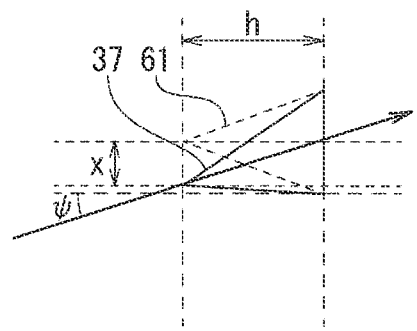
FIG. 18D is a diagram for describing a suitable shape of the projecting portion.

Further, as shown in FIG. 18A and FIG. 18C, the projecting portion 37 provided on the side wall surface 30 on the side of the end part of the pixel region 3, of the four straight grooves 29a, 29b, 29c, and 29d surrounding the pixel region 3, had a triangular shape having a side on the end part being longer than a side on the central part. By using such a triangle, it is possible to increase the number of reflections of the incident light 35 near the end part of the longitudinal direction of the straight grooves 29a, 29b, 29c, and 29d, and disperse the optical path of the reflected incident light 35 as compared with the case of using an isosceles triangle 61. As the moving distance x of the apex of the projecting portion 37, for example, as shown in FIG. 18D, the distance represented by the formula $x = h \cdot \tan \psi$ on the basis of a projection angle $\psi$ and a height h of the incident light 35 in plan view can be employed. Note that in the case where it is difficult to realize x by the above-mentioned formula, the projecting portion 37 of the side wall surface 30 on the side of the end part of the pixel region 3 may be omitted and made flat.

Incidentally, in the method of causing also the projecting portion 37 provided on the side of the end part of the pixel region 3, of the four straight grooves 29a, 29b, 29c, and 29d surrounding the pixel region 3 to have an isosceles triangle shape, the number of reflections of the incident light 35 is reduced, and the number of optical paths in which the reflected incident light 35 returns to the side of the central part of the pixel region 3 is increased. In particular, such tendency becomes more pronounced on the side of the end part of the pixel region 3, and therefore, concentration of the optical path to the side of the central part of the pixel region 3 due to the reflected incident light 35 is also concerned.

Figure 19A:
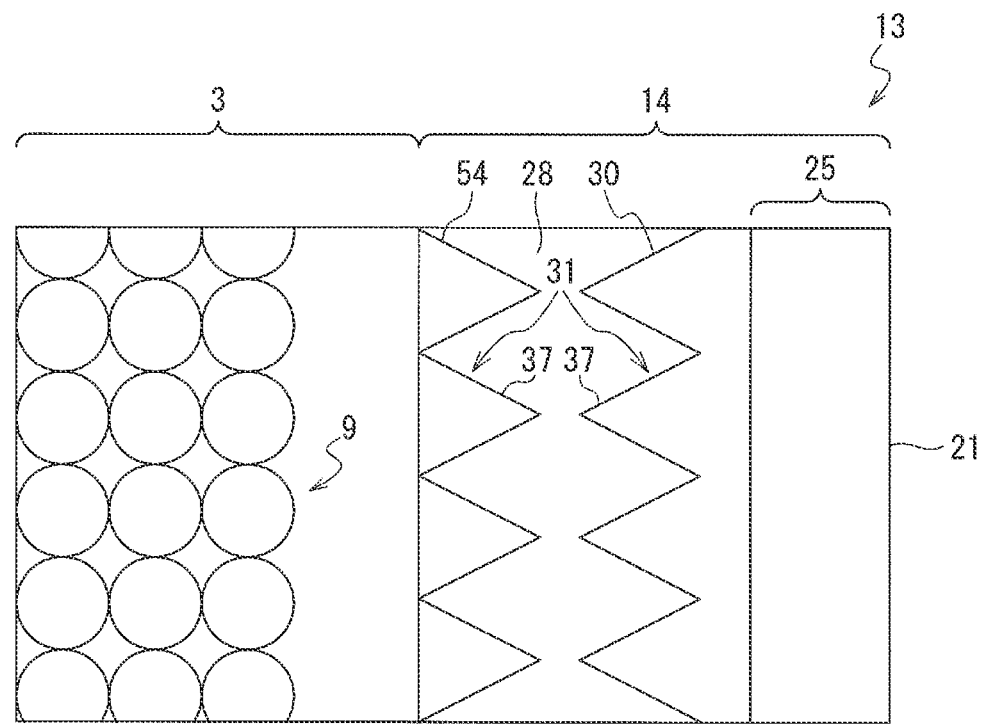
FIG. 19A is a diagram showing the planar configuration of the chip according to the modified example.
Figure 19B:
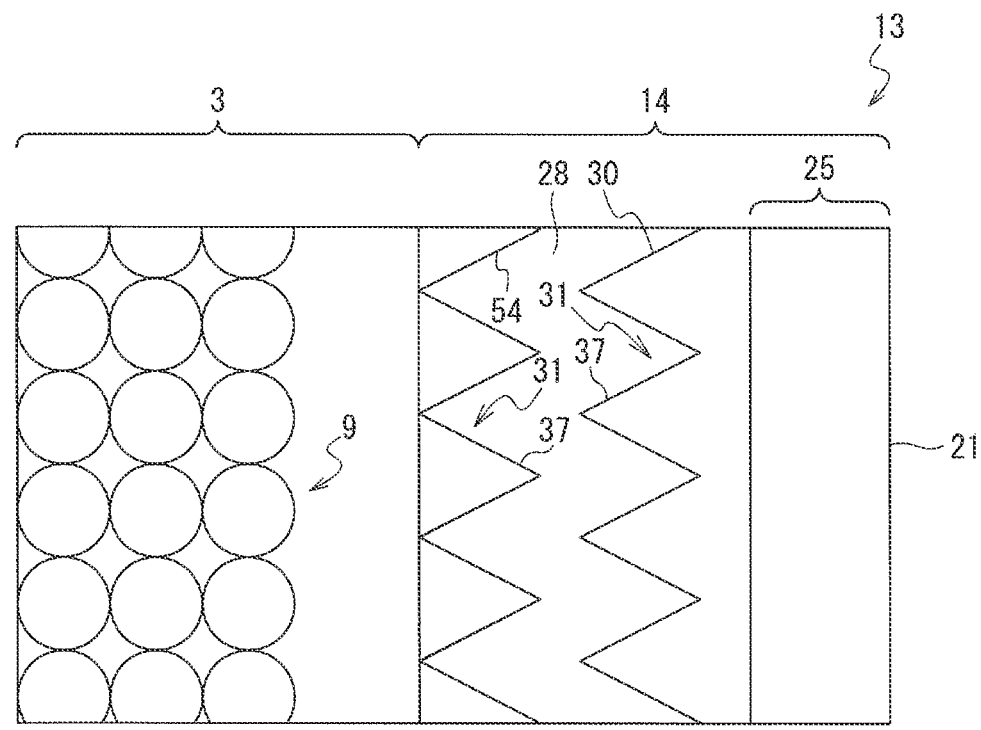
FIG. 19B is a diagram showing the planar configuration of the chip according to the modified example.

(4) Further, an example in which the recessed and projecting portions 31 is provided only on the side wall surface 30 facing the pixel region 3 side of the groove portion 28 has been described in the first embodiment, but other configurations may be employed. For example, as shown in FIG. 19A and FIG. 19B, the recessed and projecting portions 31 may be provided on each of the two side wall surfaces 30 and 54 of the groove portion 28. FIG. 19A shows an example of in which the projecting portion 37 of the recessed and projecting portions 31 of the side wall surface 30 and the projecting portion 37 of the recessed and projecting portions 31 of the side wall surface 54 are provide to face each other. Further, FIG. 19B shows an example in which the projecting portion 37 of the recessed and projecting portions 31 of the side wall surface 30 and the projecting portion 37 of the recessed and projecting portions 31 of the side wall surface 54 are provided alternately. By providing the recessed and projecting portions 31 on the two side wall surfaces 30 and 54, in the case where the incident light 35 reflected by the projecting portion 37 of the side wall surface 30 enters the projecting portion 37 of the side wall surface 54, the incident light 35 to the projecting portion 37 of the side wall surface 54 can be reflected by the surface of the projecting portion 37, the reflected incident light 35 can be reflected by the surface of another adjacent projecting portion 37, and the traveling direction can be made more complicated, thereby making it possible to scatter the incident light 35 and more appropriately suppress flare.

Figure 20:
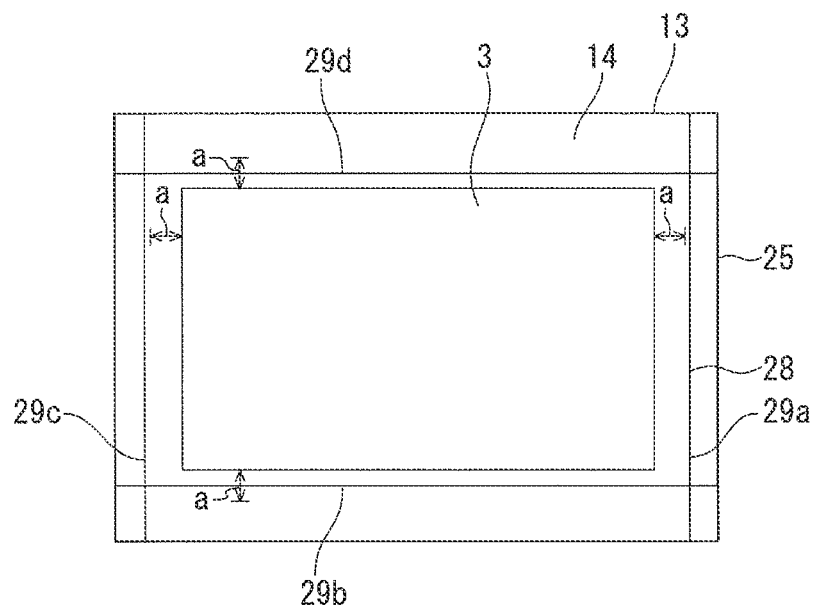
FIG. 20 is a diagram showing the planar configuration of the chip according to the modified example.

(5) Further, an example in which the recessed and projecting portions 31 are provided in the entire groove portion 28 surrounding the pixel region 3 has been described in the first embodiment, but other configurations may be employed. For example, as shown in FIG. 20, the recessed and projecting portions 31 may be provided only on the side wall surface 30 where the distance to the pixel region 3 is less than or equal to a predetermined value a, which faces the pixel region 3, of the groove portion 28 surrounding the pixel region 3. FIG. 20 shows an example in which the distance to the pixel region 3 of the straight grooves 29a and 29c of the four straight grooves 29a, 29b, 29c, and 29d surrounding the pixel region 3 is larger than the predetermined value a and the distance to the pixel region 3 of the straight grooves 29b and 29d is less than or equal to the predetermined value a. In the example shown in FIG. 20, the recessed and projecting portions 31 are provided only on the side wall surface 30 of the straight grooves 29b and 29d. As the predetermined value a, for example, it is possible to employ a distance between the pixel region 3 and the groove portion 28 at which flare does not occur due to the incident light 35 reflected by the groove portion 28. For example, 10 μm is used. That is, the present inventors have found that although flare occurs in the case where the incident light 35 is reflected by the part of the groove portion 28 having a distance to the pixel region 3 less than or equal to the predetermined value a, flare does not occur in the case where the incident light 35 is reflected by the part where the distance to the pixel region 3 is less than or equal to the predetermined value a. Therefore, by providing the recessed and projecting portions 31 only on the side wall surface 30 of the part of the groove portion 28 where the distance from the pixel region 3 is equal to or less than the predetermined value a, it is possible to reduce the range where the recessed and projecting portions 31 are formed, and suppress the generation of dust due to chipping of the leading end portion of the projecting portion 37 or the like, as compared with the method of providing the recessed and projecting portions 31 in the entire groove portion 28 surrounding the pixel region 3, for example. As a result, it is possible to more appropriately prevent dust from adhering and the solid-state imaging device 1 from becoming defective.

Figure 21:
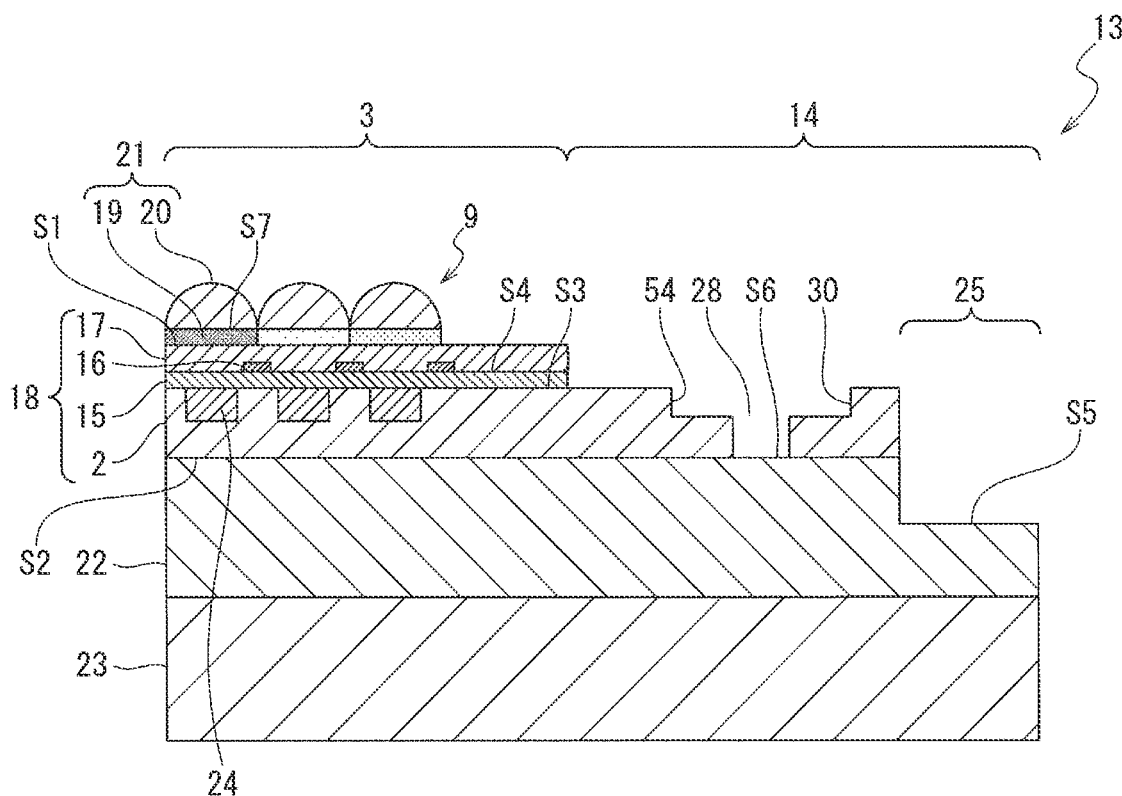
FIG. 21 is a diagram showing a cross-sectional configuration of the chip according to the modified example.
Figure 22:
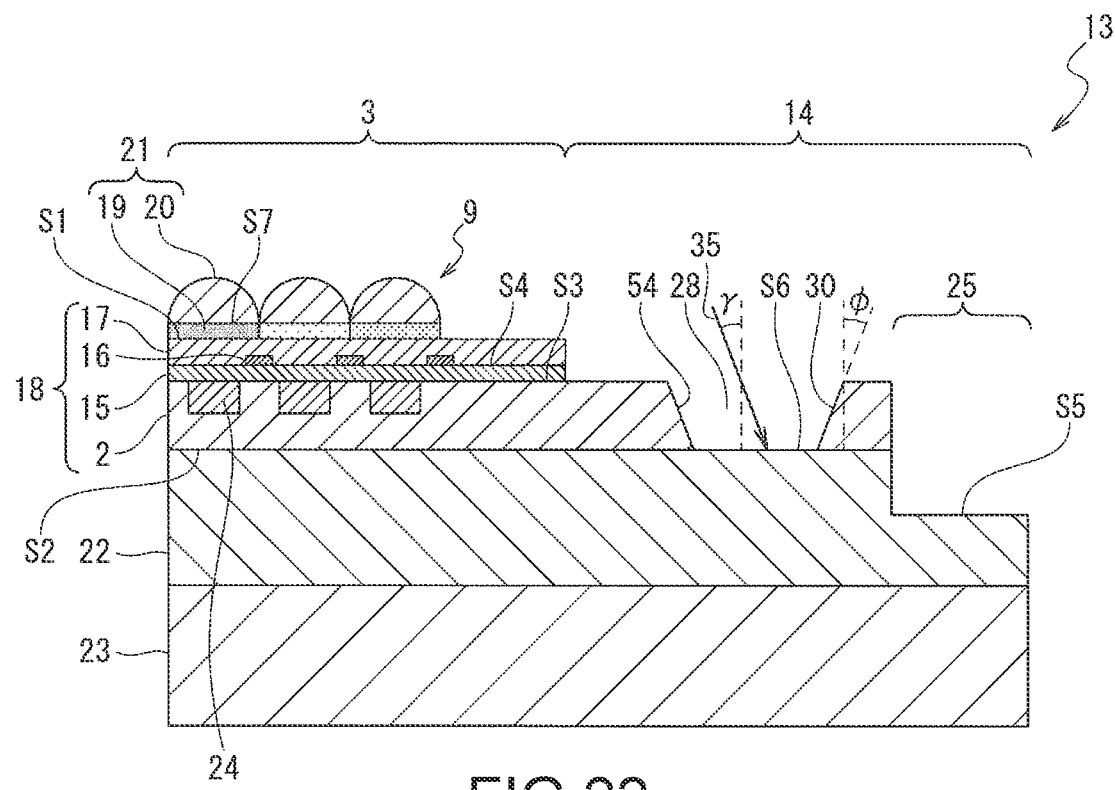
FIG. 22 is a diagram showing the cross-sectional configuration of the chip according to the modified example.

(6) Further, an example in which the side wall surface 30 is formed in a straight line extending perpendicularly to the back surface S1 of the substrate 2 has been described in the first embodiment, but other configurations may be employed. For example, at least one of the side wall surface 30 or the side wall surface 54 may be formed so as to have a shape protruding inward in the width direction of the groove portion 28 toward the bottom surface S6 side. As the shape protruding inward in the width direction of the groove portion 28 toward the bottom surface S6 side, for example, a stepped shape protruding inward in the width direction of the groove portion 28 toward the bottom surface S6 side as shown in FIG. 21, or a slope shape protruding inward in the width direction of the groove portion 28 toward the bottom surface S6 side as shown in FIG. 22 can be employed. By forming the side wall surface 30 to have such a shape, it is possible to reduce the possibility that the incident light 35 reflected by the bottom surface S6 of the groove portion 28 is applied to the side wall surface 30 and the incident light 35 reflected by the bottom surface S6 is further reflected by the side wall surface 30 and enters the photoelectric conversion unit 24. Further, by forming the side wall surface 54 to have such a shape, it is possible to cause, when the incident light 35 reflected by the side wall surface 30 is applied to the side wall surface 54, the incident light 35 to be reflected toward above the side wall surface 30, and reduce the possibility that the incident light 35 reflected by the side wall surface 54 is further reflected by the side wall surface 30 and enters the photoelectric conversion unit 24.

(7) FIG. 21 shows an example in which the recessed and projecting portions 31 are not provided on the side wall surface 30 of the groove portion 28 and each of the two side wall surfaces 30 and 54 of the groove portion 28 has a stepped shape. However, this modified example is not limited to the configuration shown in FIG. 21. For example, the side wall surfaces 30 and 54 of the groove portion 28 may have a stepped shape, and the recessed and projecting portions 31 may be provided on the side wall surface 30. The side wall surface 54, of the two side wall surfaces 30 and 54 of the groove portion 28, does not necessarily need to have a stepped shape, and only the side wall surface 30 facing the photoelectric conversion unit 24 may have a stepped shape. Alternatively, the side wall surface 30 facing the photoelectric conversion unit 24 side does not necessarily need to have a stepped shape, and only the side wall surface 54 may have a stepped shape. Further, as shown in FIG. 21, in the case where the side wall surface 30 of the groove portion 28 has a stepped shape protruding inward in the width direction of the groove portion 28 toward the bottom surface S6, it is possible to divide the optical path when reflected light enters the photoelectric conversion unit 24 into a plurality of paths to reduce the intensity of the reflected light, and suppress flare because in the case where, for example, there is the incident light 35 that has entered the groove portion 28, the reflective destination is different for each portion of the incident light 35, e.g., some portions of the incident light 35 are reflected by a step in the middle of the steps, and some other portions are reflected by the bottom surface S6.

(8) Similarly, FIG. 22 shows an example in which the recessed and projecting portions 31 are not provided on the side wall surface 30 of the groove portion 28 and each of the side wall surfaces 30 and 54 of the groove portion 28 has a slope shape. However, this modified example is not limited to the configuration shown in FIG. 22. For example, the side wall surface 30 of the groove portion 28 may have a slope shape and the recessed and projecting portions 31 may be provided. The side wall surface 54, of the two side wall surfaces 30 and 54 of the groove portion 28, does not necessarily need to have a slope shape, and only the side wall surface 30 facing the photoelectric conversion unit 24 side may have a slope shape. Alternatively, the side wall surface 30 facing the photoelectric conversion unit 24 side does not necessarily need to have a slope shape, and only the side wall surface 54 may have a slope shape. Further, as shown in FIG. 22, in the case where the side wall surface 30 of the groove portion 28 has a slope shape protruding inward in the width direction of the groove portion 28 toward a bottom surface 6S side, an angle $\varphi$ formed by the side wall surface 30 of the groove portion 28 and the normal line of the bottom surface 6S of the groove portion 28 is more than or equal to an angle $\gamma$ formed by the incident light 35 and the normal line of the bottom surface S6 of the groove portion 28 as viewed from the longitudinal direction of the groove portion 28, the incident light 35 being assumed to enter the groove portion 28 where the camera module 32 shown in FIG. 7A and FIG. 8 includes the solid-state imaging device 1. Note that the angle of incidence of the incident light 35 on the bottom surface S6 of the groove portion 28 has a certain range, but the angle $\gamma$ is the angle at which the intensity of the incident light 35 is the strongest among the angles of incidence having a certain range. For example, the calculation can be performed by simulating the optical system in the case where the camera module 32 is configured. As shown in FIG. 22, in the case where $\varphi \leq \gamma$, for example, it is possible to prevent the incident light 35 reflected by the side wall surface 30 facing the photoelectric conversion unit 24 side from entering the photoelectric conversion unit 24, and suppress flare.

Figure 23:
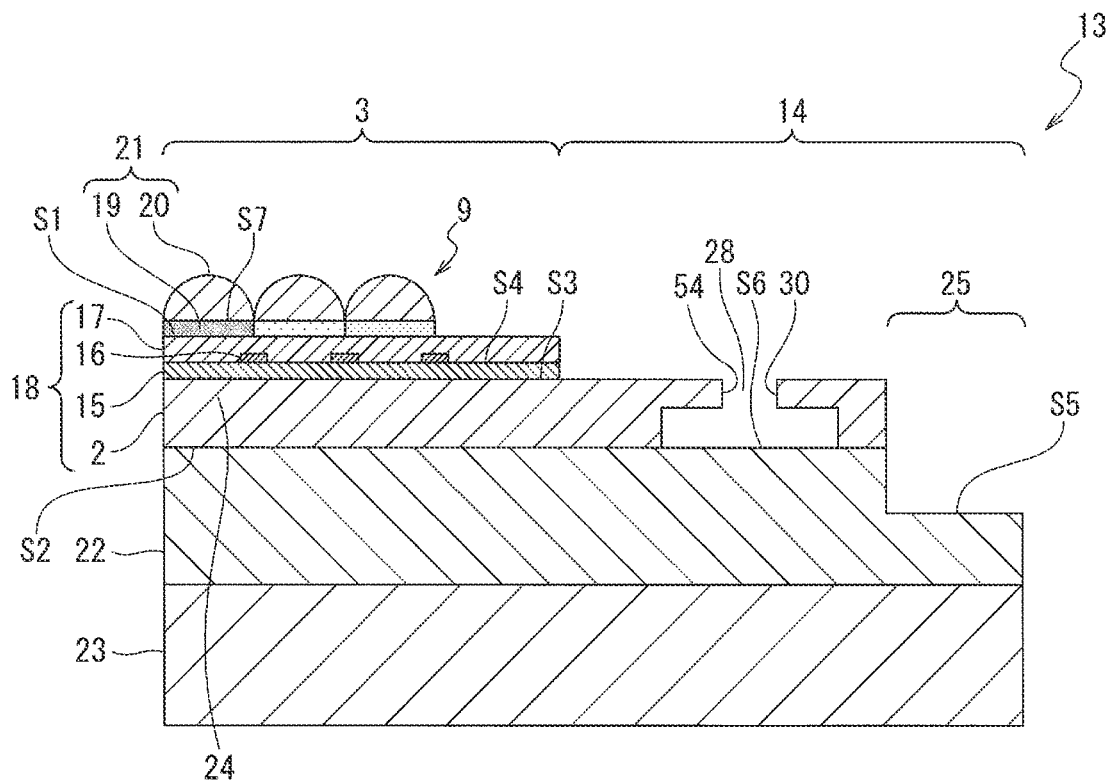
FIG. 23 is a diagram showing the cross-sectional configuration of the chip according to the modified example.
Figure 24:
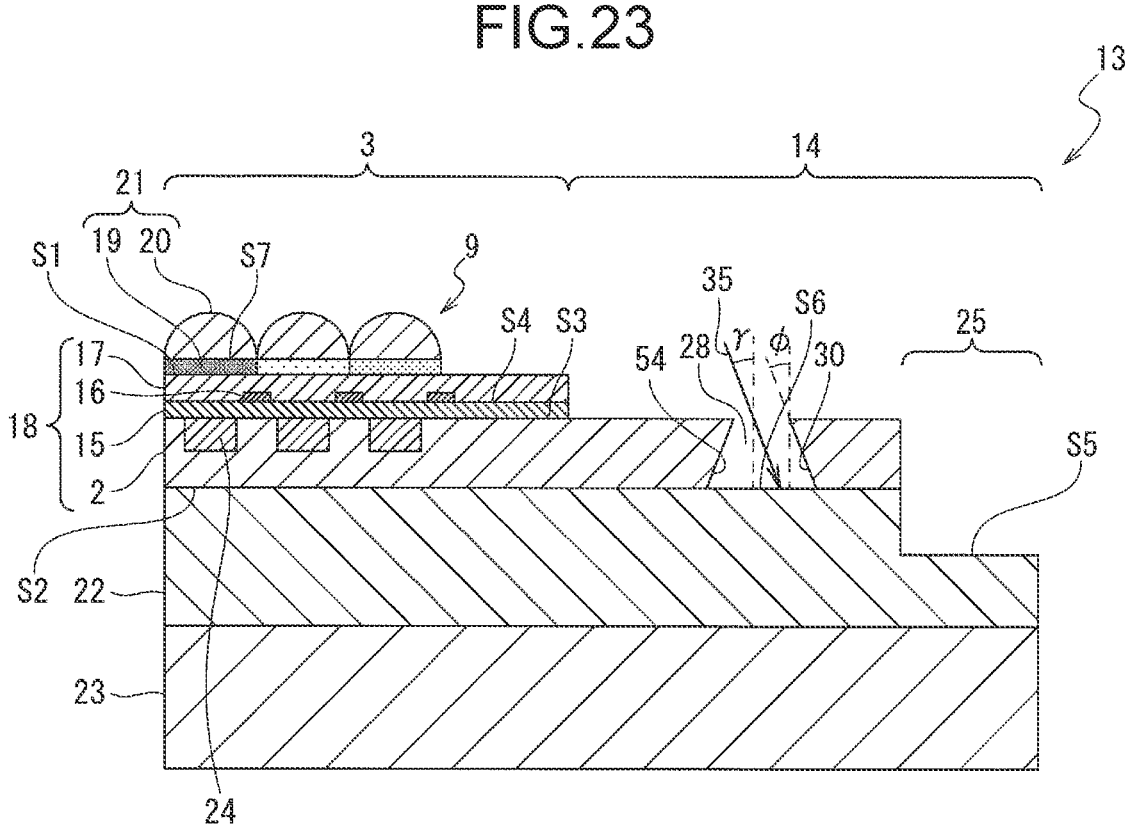
FIG. 24 is a diagram showing the cross-sectional configuration of the chip according to the modified example.

(9) Further, for example, at least one of the side wall surface 30 or the side wall surface 54 may have a shape protruding inward in the width direction of the groove portion 28 toward the opening side. As the shape protruding inward in the width direction of the groove portion 28 toward the opening side, for example, a stepped shape protruding inward in the width direction of the groove portion 28 toward the opening side as shown in FIG. 23, or a slope shape protruding inward in the width direction of the groove portion 28 toward the opening side as shown in FIG. 24 can be employed. By forming the side wall surface 30 to have such a shape, it is possible to reduce the incident light 35 that reaches the bottom surface S6 of the groove portion 28. Further, the incident light 35 reflected by the bottom surface S6 of the groove portion 28 can be repeatedly reflected between the side wall surfaces 30 and 54 of the groove portion 28, and the intensity of the incident light 35 can be reduced by increasing the number of reflections. Further, by forming the side wall surface 54 to have such a shape, the incident light 35 that has been reflected by the side wall surface 30 and applied to the side wall surface 54 can be repeatedly reflected between the side wall surfaces 30 and 54 of the groove portion 28, and the intensity of the incident light 35 can be reduced by increasing the number of reflections.

(10) FIG. 23 shows an example in which the recessed and projecting portions 31 are not provided on the side wall surface 30 of the groove portion 28 and each of the two side wall surfaces 30 and 54 of the groove portion 28 has a stepped shape. However, this modified example is not limited to the configuration shown in FIG. 23. For example, the side wall surfaces 30 and 54 of the groove portion 28 may have a stepped shape and the recessed and projecting portions 31 may be provided on the side wall surface 30. The side wall surface 54, of the two side wall surfaces 30 and 54 of the groove portion 28, does not necessarily need to have a stepped shape and only the side wall surface 30 facing the photoelectric conversion unit 24 may have a stepped shape. Alternatively, the side wall surface 30 facing the photoelectric conversion unit 24 side does not necessarily need to have a stepped shape and only the side wall surface 54 may have a stepped shape. Further, in the case where the side wall surface 30 of the groove portion 28 has a stepped shape protruding inward in the width direction of the groove portion 28 toward the opening side as shown in FIG. 23, for example, the incident light 35 reflected by the bottom surface S6 of the groove portion 28 can be repeatedly reflected between the bottom surface S6 and the side wall surface 30, and the intensity of the incident light 35 can be reduced by increasing the number of reflections.

(11) Similarly, FIG. 24 shows an example in which the recessed and projecting portions 31 are not provided on the side wall surface 30 of the groove portion 28 and each of the two side wall surfaces 30 and 54 of the groove portion 28 has a slope shape. However, this modified example is not limited to the configuration shown in FIG. 24. For example, the side wall surface 30 of the groove portion 28 may have a slope shape and the recessed and projecting portions 31 may be provided. The side wall surface 54, of the two side wall surfaces 30 and 54 of the groove portion 28, does not necessarily need to have a slope shape, and only the side wall surface 30 facing the photoelectric conversion unit 24 may have a slope shape. Alternatively, the side wall surface 30 facing the photoelectric conversion unit 24 side does not necessarily need to have a slope shape, and only the side wall surface 54 side may have a slope shape. Further, in the case where the side wall surface 30 of the groove portion 28 has a slope shape protruding inward in the width direction of the groove portion 28 toward the opening side as shown in FIG. 24, an angle φ formed by the side wall surface 30 of the groove portion 28 and the normal line of the bottom surface 6S of the groove portion 28 is more than or equal to an angle γ formed by the incident light 35 and the normal line of the bottom surface S6 of the groove portion 28 as viewed from the longitudinal direction of the groove portion 28, the incident light 35 being assumed to enter the groove portion 28 where the camera module 32 shown in FIG. 7A and FIG. 8 includes the solid-state imaging device 1. As shown in FIG. 24, in the case where φ≥γ, for example, the incident light 35 reflected by the bottom surface S6 of the groove portion 28 can be repeatedly reflected between the bottom surface S6 and the slope, and the intensity of the incident light 35 can be reduced by increasing the number of reflections.

Figure 25:
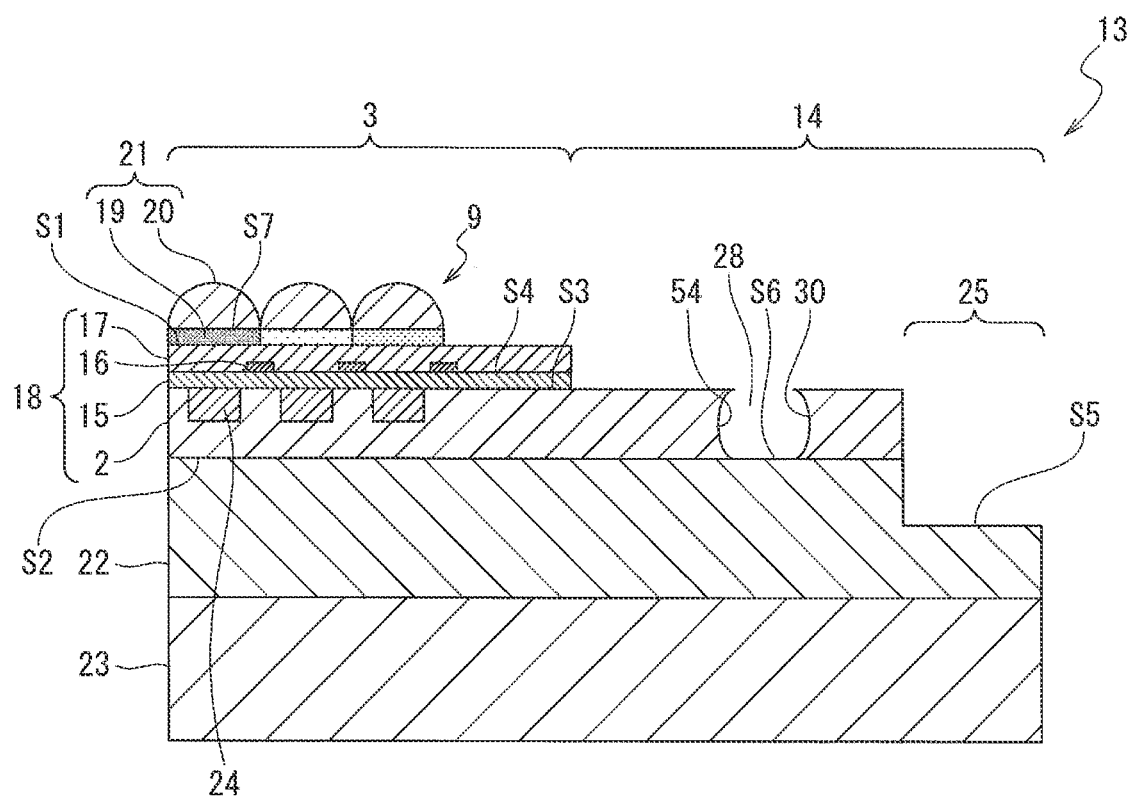
FIG. 25 is a diagram showing the cross-sectional configuration of the chip according to the modified example.
Figure 26:
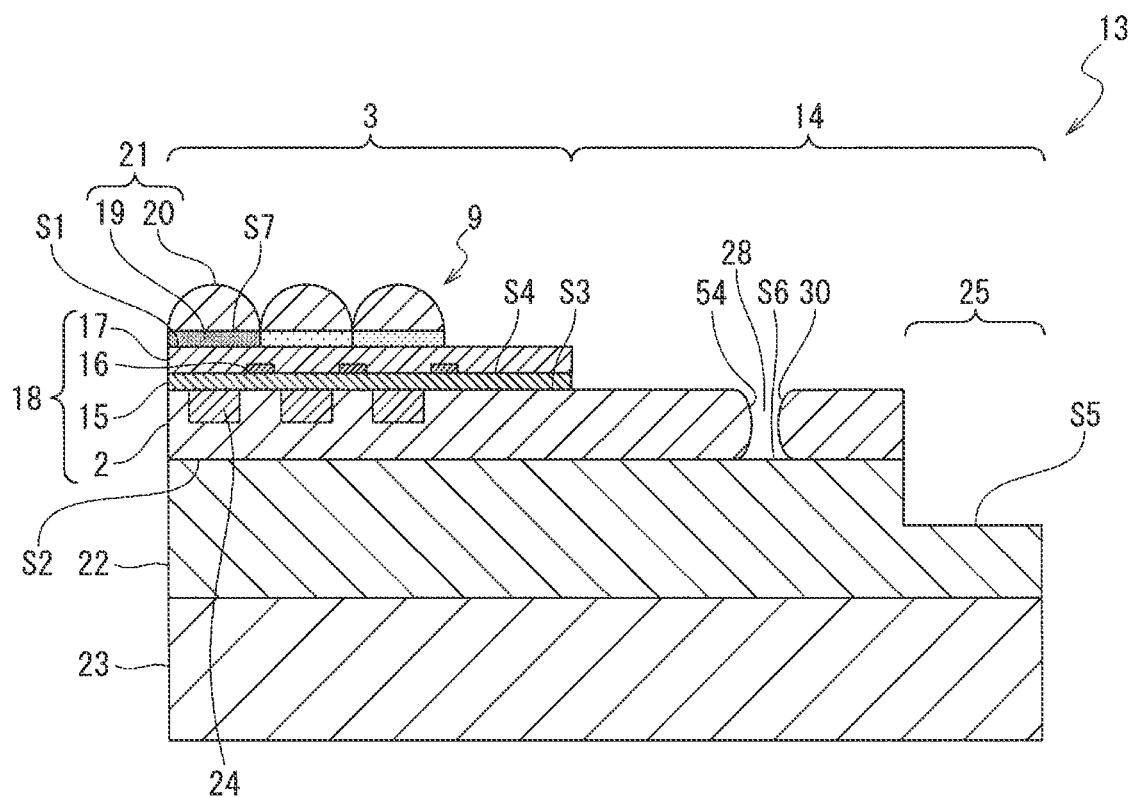
FIG. 26 is a diagram showing the cross-sectional configuration of the chip according to the modified example.

(12) Further, in the first embodiment, for example, at least one of the cross-sectional shape of the side wall surface 30 and the cross-sectional shape of the side wall surface 54 may be an arc shape protruding outward in the width direction of the groove portion 28 as shown in FIG. 25 or an arc shape protruding inward in the width direction of the groove portion 28 as shown in FIG. 26. FIG. 25 and FIG. 26 show an example in which the recessed and projecting portions 31 are not provided on the side wall surface 30 of the groove portion 28 and the cross-sectional shape of each of the two side wall surfaces 30 and 54 of the groove portion 28 is an arc shape. However, this modified example is not limited to the configurations shown in FIG. 25 and FIG. 26. For example, the cross-sectional shape of the side wall surface 30 of the groove portion 28 may be an arc shape and the recessed and projecting portions 31 may be provided. The cross-sectional shape of the side wall surface 54 does not necessarily need to be an arc shape, and only the cross-sectional shape of the side wall surface 30 facing the photoelectric conversion unit 24 side may be an arch shape. Alternatively, the cross-sectional shape of the side wall surface 30 facing the photoelectric conversion unit 24 side does not necessarily need to be an arc shape, and only the cross-sectional shape of the side wall surface 54 may be an arc shape.

Further, for example, in the case where at least one of the cross-sectional shape of the side wall surface 30 or the cross-sectional shape of the side wall surface 54 is an arc shape protruding outward in the width direction of the groove portion 28 as shown in FIG. 25, the incident light 35 that reaches the bottom surface S6 of the groove portion 28 can be reduced. Further, the incident light 35 reflected by the bottom surface S6 of the groove portion 28 can be repeatedly reflected between the side wall surfaces 30 and 54 of the groove portion 28, and the intensity of the incident light 35 can be reduced by increasing the number of reflections. Further, as shown in FIG. 26, for example, the possibility that the incident light 35 reflected by the bottom surface S6 of the groove portion 28 is applied to the side wall surface 30 can be reduced, and the possibility that the incident light 35 reflected by the bottom surface S6 is further reflected by the side wall surface 30 and enters the photoelectric conversion unit 24 can be reduced.

Figure 27:
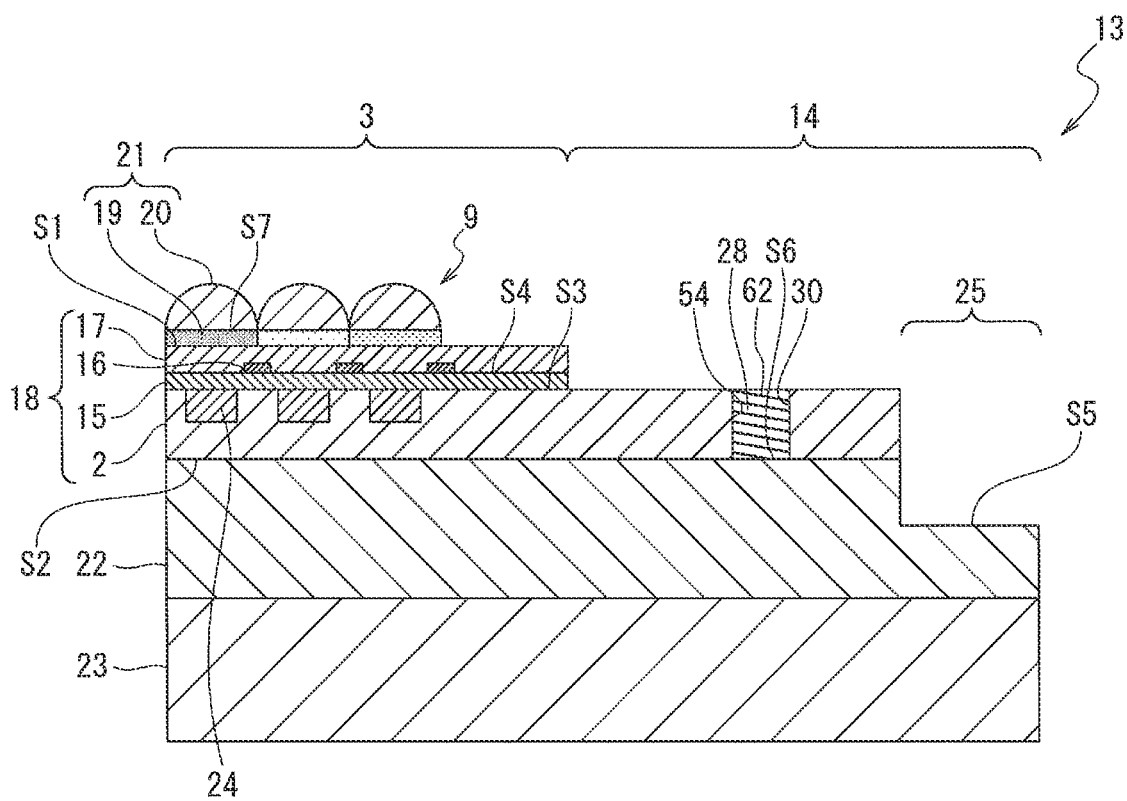
FIG. 27 is a diagram showing the cross-sectional configuration of the chip according to the modified example.
Figure 28:
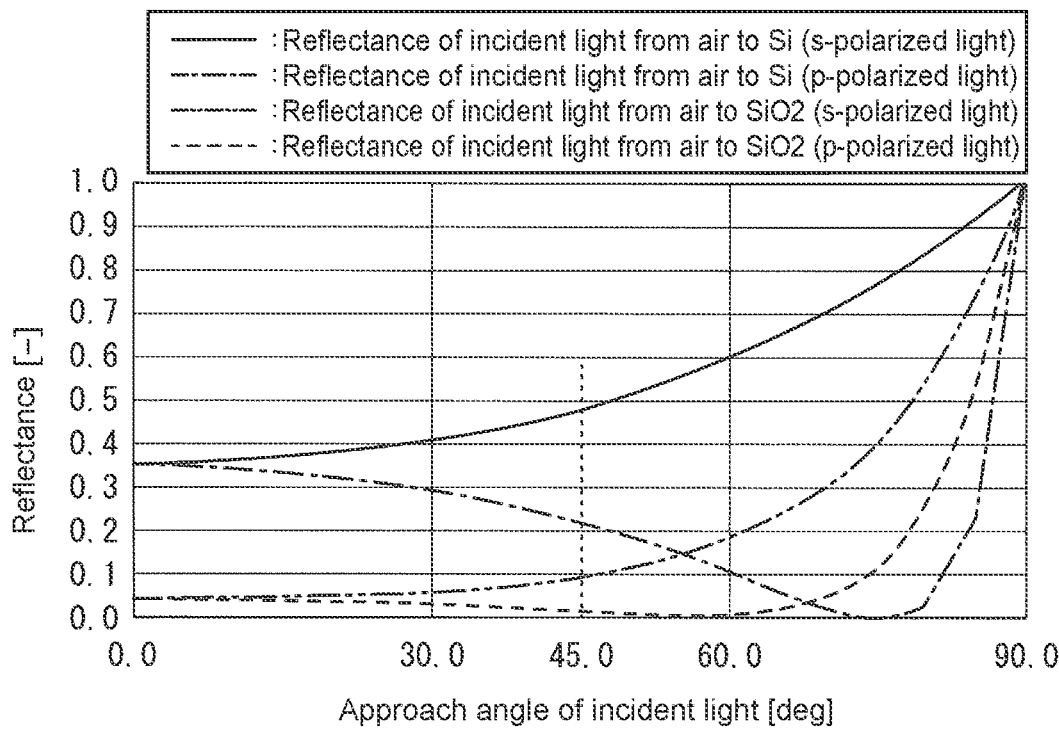
FIG. 28 is a diagram showing a relationship between the approach angle and reflectance of incident light.

(13) Further, an example in which the inside of the groove portion 28 is a gap has been shown in the first embodiment, but other configurations may be employed. For example, as shown in FIG. 27, a part or all of the groove portion 28 may be filled to the opening with a material 55 different from that of the substrate 2. FIG. 27 shows an example in which the side wall surface 30 of the groove portion 28 is flattened without providing the recessed and projecting portions 31 on the side wall surface 30. However, this modified example is not limited to the configuration shown in FIG. 27. For example, a part or all of the groove portion 28 may be filled with the material 55 to the opening and the recessed and projecting portions 31 may be provided. As the material 55 to fill the groove portion 28, for example, a silicon oxide ($SiO_2$) is favorable. The silicon oxide ($SiO_2$) is easy to handle as a semiconductor material, e.g., it is used also for the insulating film of the wiring layer 22. Further, as shown in FIG. 28, in the case where the approach angle of the incident light 35 to the groove portion 28 is 45 degrees and a wavelength λ of the incident light 35=630 nm, the reflectance is expected to be increased by about 10% in the opening of the groove portion 28 as compared with the configuration in which a silicon oxide ($SiO_2$) is not buried in the groove portion 28 in which the side wall surfaces 30 and 54 and the bottom surface S6 are formed of silicon (Si), so that the amount of light contributing to flare can be reduced. Note that there is a possibility that filling the groove portion 28 with the material 55 weakens the ability of the groove portion 28 to prevent cracking from progressing into the pixel region 3, but a silicon oxide ($SiO_2$) has mechanical strength lower than that of silicon (Si), and thus, the effect of absorbing the energy of the cracking and stopping the progress of the cracking into the pixel region 3 is expected.

Figure 29:
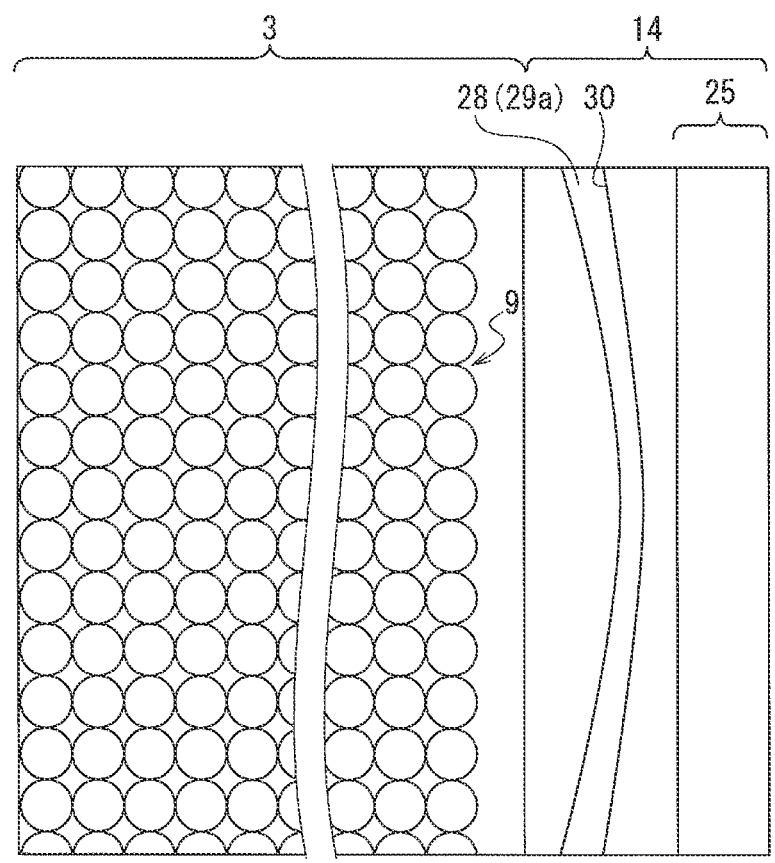
FIG. 29 is a diagram showing the planar configuration of the chip according to the modified example.

(14) Further, for example, as shown in FIG. 29, the width of the groove portion 28 may be different from one place to another in the longitudinal direction of the groove portion 28 so that the incident light 35 reflected by the groove portion 28 goes out of the groove portion 28 and then is directed in a direction opposite to the photoelectric conversion unit 24 side. FIG. 29 shows an example in which the side wall surface 30 is flat without providing the recessed and projecting portions 31 on the side wall surface 30 of the groove portion 28. However, this modified example is not limited to the configuration shown in FIG. 29. For example, the recessed and projecting portions 31 may be provided on the side wall surface 30 of the groove portion 28. The recessed and projecting portions 31 may be provided and all or a part of the inside of the groove portion 28 may be filled with the material 55. Alternatively, all or a part of the inside of the groove portion 28 may be filled to the opening with the material 55 without providing the recessed and projecting portions 31.

Figure 30A:
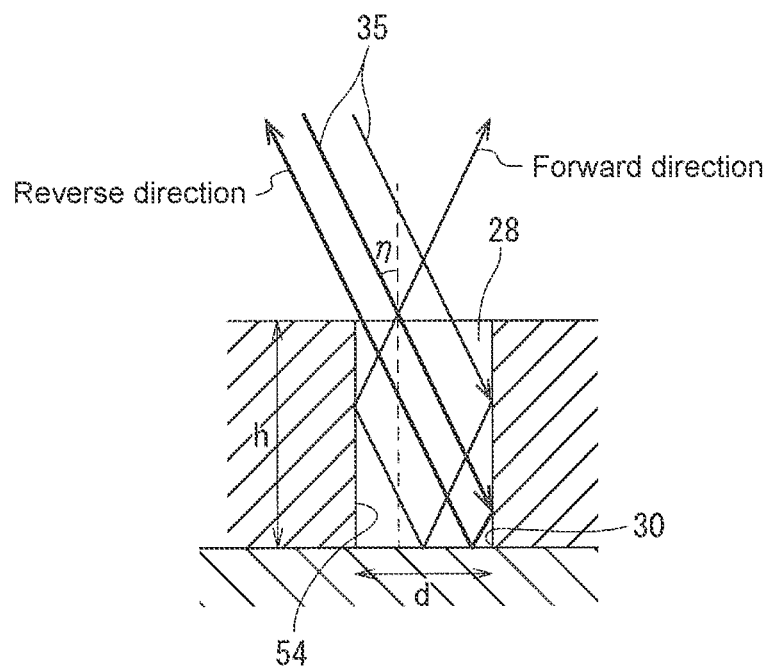
FIG. 30A is a diagram for describing a direction in which the incident light is reflected.
Figure 30B:
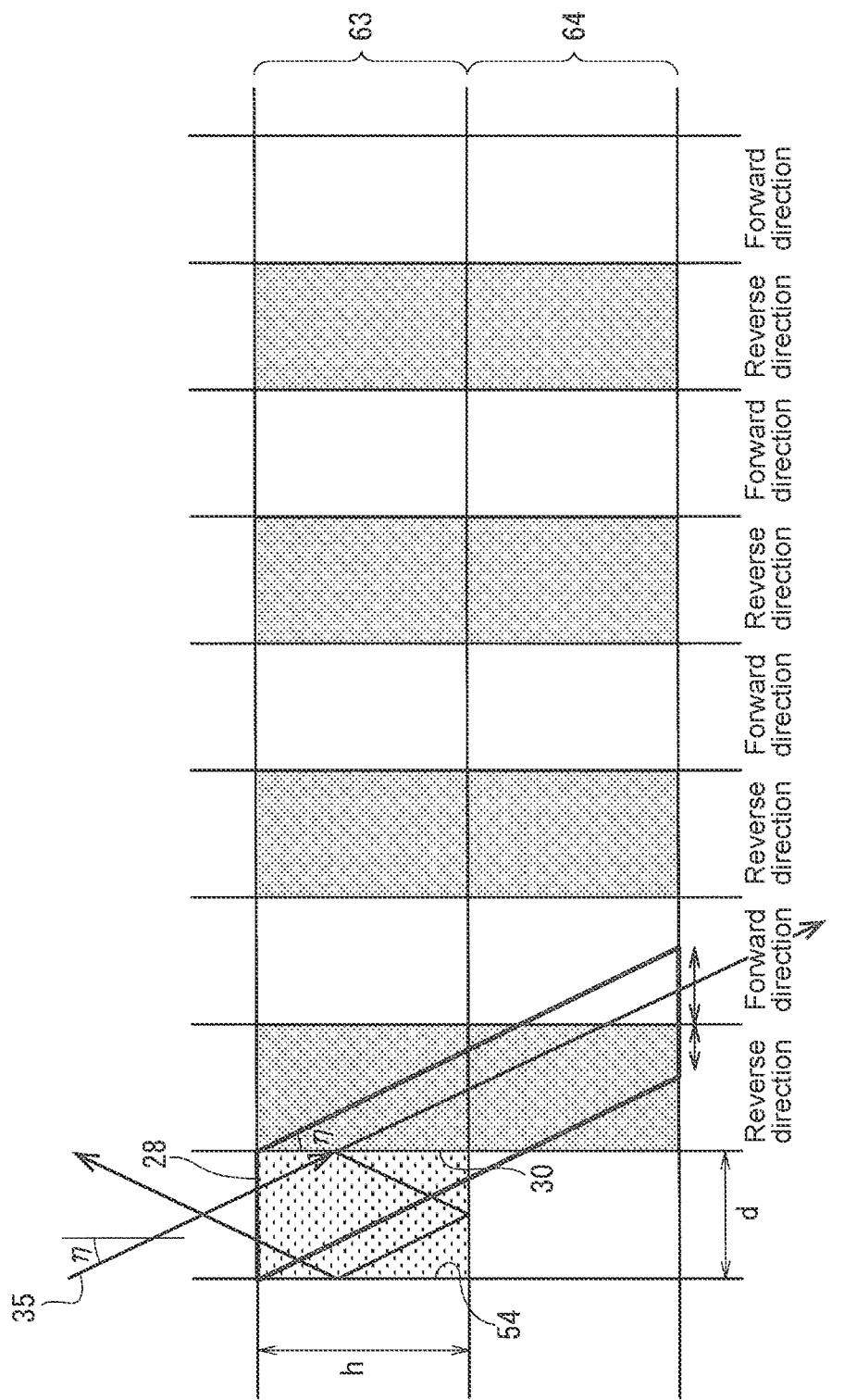
FIG. 30B is a diagram for describing the direction in which the incident light is reflected.

Here, by changing the width of the groove portion 28 widths, or the like, as shown in FIG. 30A, the incident light 35 that has entered the groove portion 28 at an angle η can be returned to the direction in which the incident light 35 has entered (hereinafter, referred to also as the "reverse direction") or can be caused to travel in the direction opposite to the direction in which the incident light 35 has entered (hereinafter, referred to also as the "forward direction"). First, as shown in FIG. 30B, assuming that the cross-sectional shape of the groove portion 28 is a rectangular shape, a diagram of a grid including a first rectangular column 63 in which a plurality of rectangles having the same shape as the cross-sectional shape of the groove portion 28 is arranged in the right direction of the groove portion 28, and a second rectangular column 64 in which rectangular columns similar to the first rectangular column 63 are arranged below the first rectangular column 63 is created. Subsequently, the incident light 35 that has entered the groove portion 28 at a certain angle η is drawn in the created diagram of the grid. In the diagram of the grid, the incident light 35 is drawn to pass through other rectangles of the first rectangular column 63 and the second rectangular column 64 without being reflected by the side wall surface 30. By referring to the diagram of the grid in which the incident light 35 has been drawn, in the case where the incident light 35 passes through the bottom portion of the odd-numbered rectangle counted from the groove portion 28, of the rectangles constituting the second rectangular column 64, it can be determined that the incident light 35 travels in the opposite direction. Meanwhile, in the case where the incident light 35 passes through the bottom portion of the even-numbered rectangles counted from the groove portion 28, it can be determined that the incident light 35 travels in the forward direction.

Therefore, the incident light 35 that has entered the opening end of the side wall surface 30 of the groove portion 28 at a certain angle η and the incident light 35 that has entered the opening end of the side wall surface 54 of the groove portion 28 at a certain angle η are drawn in the diagram of the grid, and the width of the groove portion 28 is adjusted so that both of the two drawn incident lights 35 pass through the bottom portion of the even-numbered rectangle counted from the groove portion 28, of the rectangles constituting the second rectangular column 64, thereby making it possible to cause the incident light 35 to be directed in the forward direction, i.e., the side opposite to the photoelectric conversion unit 24 side. Further, the angle η at which the incident light 35 enters differs from one place to another in the longitudinal direction of the groove portion 28. Therefore, by adjusting the width of the groove portion 28 from one place to another in the longitudinal direction of the groove portion 28, the incident light 35 reflected by the groove portion 28 can be directed in the forward direction, i.e., the side opposite to the photoelectric conversion unit 24 side when the incident light 35 goes out of the groove portion 28, at places in the longitudinal direction of the groove portion 28.

(15) Further, an example in which the distance between the pixel region 3 and the groove portion 28 (the distance between the pixel region 3 and a straight groove 29a, the distance between the pixel region 3 and a straight groove 29b, the distance between the pixel region 3 and a straight groove 29c, and the distance between the pixel region 3 and a straight groove 29d) is constant has been described in the first embodiment, but other configurations may be employed. For example, as shown in FIG. 29, the distance between the pixel region 3 and the groove portion 28 may be different from one place to another in the longitudinal direction of the groove portion 28 so that the incident light 35 reflected by the groove portion 28 goes out of the groove portion 28 and then is directed to the side opposite to the photoelectric conversion unit 24 side. FIG. 29 shows an example in which the side wall surface 30 is flat without providing the recessed and projecting portions 31 on the side wall surface 30 of the groove portion 28. However, this modified example is not limited to the configuration shown in FIG. 29. For example, the recessed and projecting portions 31 may be provided on the side wall surface 30 of the groove portion 28. The recessed and projecting portions 31 may be provided on the side wall surface 30 of the groove portion 28, and all or a part of the inside of the groove portion 28 may be filled with the material 55 to the opening. Alternatively, the recessed and projecting portions 31 does not necessarily need to be provided on the side wall surface 30 of the groove portion 28, and all or part of the inside of the groove portion 28 may be filled to the opening with the material 55. Further, the width of the groove portion 28 may be constant over the longitudinal direction.

Figure 31A:
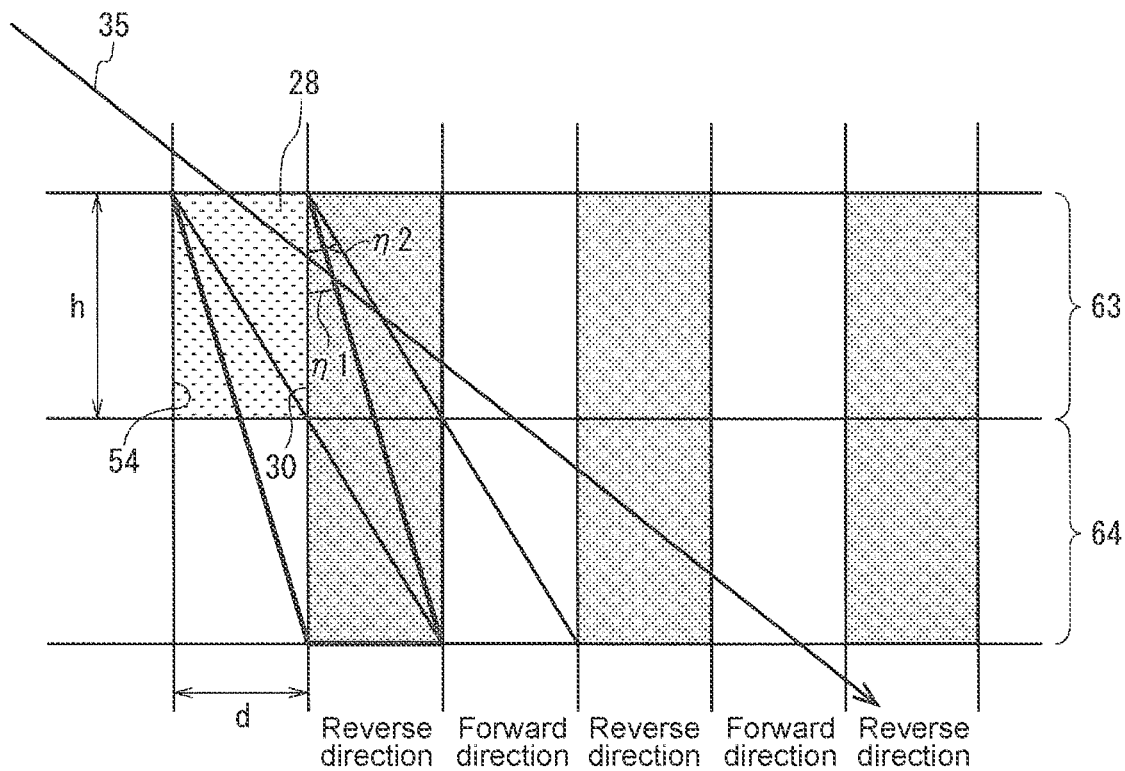
FIG. 31A is a diagram for describing the direction in which the incident light is reflected.
Figure 31B:
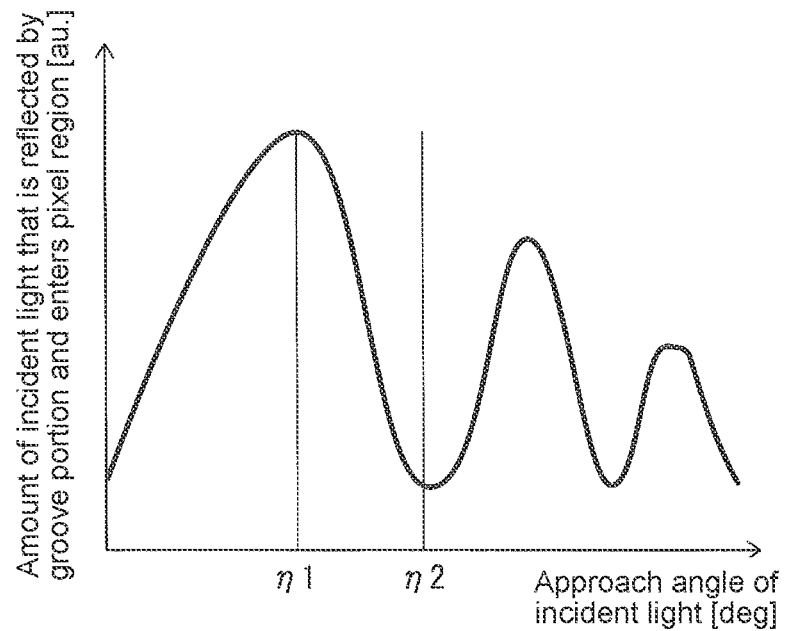
FIG. 31B is a diagram showing a relationship between the approach angle and light amount of the incident light and the light amount of reflected light.

Here, in the case of using a method of referring to the diagram of the grid of FIG. 30B as described above, when the angle η at which the incident light 35 enters is gradually changed as shown in FIG. 31A and FIG. 31B, the angle at which the incident light 35 is reflected in the opposite direction and the angle at which the incident light 35 is reflected in the forward direction alternately appear. FIG. 31B shows the amount of the incident light 35 being reflected by the groove portion 28 and entering the pixel region 3. Further, angles η1 and η2 in FIG. 31B correspond to angles η1 and η2 in FIG. 31A. Further, the longer the distance between the pixel region 3 and the groove portion 28, the larger the angle η, and the shorter the distance between the pixel region 3 and the groove portion 28, the smaller the angle η. Therefore, by adjusting the distance between the pixel region 3 and the groove portion 28 from one place to another in the longitudinal direction of the groove portion 28, the incident light 35 reflected by the groove portion 28 can be directed to the side opposite to the photoelectric conversion unit 24 side when the incident light 35 goes out of the groove portion 28, at various places in the longitudinal direction of the groove portion 28. Note that the adjustment of the width of the groove portion 28 as described in (14) above may be simultaneously performed.

2. Second Embodiment: Electronic Apparatus

Next, an electronic apparatus according to a second embodiment of the present disclosure will be described. FIG. 32 is a schematic configuration diagram of an electronic apparatus 100 according to the second embodiment of the present disclosure.

The electronic apparatus 100 according to a second embodiment includes a solid-state imaging device 101, the optical lens 102, a shutter device 103, a drive circuit 104, and a signal processing circuit 105. The electronic apparatus 100 according to the second embodiment shows an embodiment in the case where the solid-state imaging device 1 according to the first embodiment of the present disclosure or Comparative Example is used for an electronic apparatus (e.g., camera) as the solid-state imaging device 101.

The optical lens 102 images the image light (the incident light 106) from a subject onto the imaging surface of the solid-state imaging device 101. As a result, signal charges are accumulated in the solid-state imaging device 101 for a certain time. The shutter device 103 controls a period in which the solid-state imaging device 101 is irradiated with light and a period in which light is shielded. The drive circuit 104 supplies drive signals for controlling the transfer operation of the solid-state imaging device 101 and the shutter operation of the shutter device 103. In accordance with the drive signal (timing signal) supplied from the drive circuit 104, signal transfer of the solid-state imaging device 101 is performed. The signal processing circuit 105 performs various types of signal processing on a signal (pixel signal) output from the solid-state imaging device 101. The video signal on which signal processing has been performed is stored in a storage medium such as a memory, or is output to a monitor.

With such a configuration, in the electronic apparatus 100 according to the second embodiment, since the optical color mixing is suppressed in the solid-state imaging device 101, the image quality of the video signals can be improved.

Note that the electronic apparatus 100 to which the solid-state imaging device 1 can be applied is not limited to a camera, and the solid-state imaging device 1 can be applied to other electronic apparatuses. For example, the solid-state imaging device 1 may be applied to an imaging device such as a camera module for a mobile device such as a mobile phone.

Further, the solid-state imaging device 1 according to the first embodiment is used for an electronic apparatus as the solid-state imaging device 101 in the second embodiment, but other configurations may be used. For example, the solid-state imaging device 1 according to the modified example may be used for an electronic apparatus.

Note that the present technology may take the following configurations.

(1) A solid-state imaging device, including:
  a substrate on which a plurality of photoelectric conversion units has been formed;
  a groove portion provided on a side of a light-receiving surface of the substrate; and
  recessed and projecting portions provided on a side wall surface of the groove portion facing a side of the plurality of photoelectric conversion units.

(2) The solid-state imaging device according to (1) above, in which
  the recessed and projecting portions have a shape that scatters incident light from the side of the light-receiving surface of the substrate.

(3) The solid-state imaging device according to (1) or (2) above, in which
  a pitch of irregularities of the recessed and projecting portions is 0.1 um or more and less than 100 um.

(4) The solid-state imaging device according to any one of (1) to (3) above, in which
  the recessed and projecting portions have a saw blade shape in which triangles are consecutive as viewed from the side of the light-receiving surface of the substrate.

(5) The solid-state imaging device according to (4) above, in which
  an angle of each of the triangles of the recessed and projecting portions is 1° or more and less than 80°.

(6) The solid-state imaging device according to (5) above, in which
  the angle of each of the triangles of the recessed and projecting portions is 1° or more and 60° or less.

(7) The solid-state imaging device according to (6) above, in which
  the angle of each of the triangles of the recessed and projecting portions is 30°±10°.

(8) The solid-state imaging device according to any one of (3) to (7) above, in which
  a shape of each of the triangles varies from one place to another in a longitudinal direction of the groove portion.

(9) The solid-state imaging device according to (8) above, in which
  the groove portion is provided between a scribe region and a pixel region to have a rectangular shape surrounding the pixel region, the scribe region being diced by a blade, the pixel region including the plurality of photoelectric conversion units, and
  the recessed and projecting portions are formed on the side wall surface on a side of a central portion of the pixel region to have an isosceles triangle shape and on the side wall surface on a side of an end portion of the pixel region to have a triangular shape having a side on the end portion being longer than a side on the central portion.

(10) The solid-state imaging device according to any one of (1) to (9) above, in which
  the recessed and projecting portions have a shape obtained by arranging a plurality of cone-shaped solids in array.

(11) The solid-state imaging device according to any one of (1) to (10) above, in which
  the recessed and projecting portions are provided on each of two side wall surfaces of the groove portion.

(12) The solid-state imaging device according to any one of (1) to (11) above, in which
  the substrate is formed of silicon.

(13) The solid-state imaging device according to any one of (1) to (12) above, in which
  the groove portion is provided between a scribe region and a pixel region to have a rectangular shape surrounding the pixel region, the scribe region being diced by a blade, the pixel region including the plurality of photoelectric conversion units.

(14) The solid-state imaging device according to (13) above, in which
  the recessed and projecting portions are provided only on a side wall surface of the groove portion forming sides of the rectangular shape, the side wall surface facing a side of the pixel region, a distance between the side wall surface and the pixel region being less than or equal to a predetermined value.

(15) A solid-state imaging device including:
  a substrate on which a plurality of photoelectric conversion units has been formed; and
  a groove portion provided on a side of a light-receiving surface of the substrate; in which
  a side wall surface of the groove portion has a shape protruding inward in a width direction of the groove portion toward a side of a bottom surface.

(16) The solid-state imaging device according to (15) above, in which
  a side wall surface of the groove portion has a stepped shape protruding inward in a width direction of the groove portion toward a side of a bottom surface.

(17) The solid-state imaging device according to (15) above, in which
  a side wall surface of the groove portion has a slope shape protruding inward in a width direction of the groove portion toward a side of a bottom surface.

(18) The solid-state imaging device according to (17) above, in which
  an angle formed by the side wall surface of the groove portion and a normal line of the bottom surface is less than or equal to an angle formed by incident light and the normal line of the bottom surface of the groove portion as viewed from a longitudinal direction of the groove portion, the incident light being assumed to enter the groove portion where a camera module includes the solid-state imaging device.

(19) A solid-state imaging device, including:
a substrate on which a plurality of photoelectric conversion units has been formed; and
a groove portion provided on a side of a light-receiving surface of the substrate, in which
a side wall surface of the groove portion has a shape protruding inward in a width direction of the groove portion toward a side of an opening.

(20) The solid-state imaging device according to (19) above, in which
the side wall surface of the groove portion has a stepped shape protruding inward in the width direction of the groove portion toward the side of the opening.

(21) The solid-state imaging device according to (19) above, in which
the side wall surface of the groove portion has a slope shape protruding inward in the width direction of the groove portion toward the side of the opening.

(22) The solid-state imaging device according to (21) above, in which
an angle formed by the side wall surface of the groove portion and a normal line of the bottom surface is more than or equal to an angle formed by incident light and the normal line of the bottom surface of the groove portion as viewed from a longitudinal direction of the groove portion, the incident light being assumed to enter the groove portion where a camera module includes the solid-state imaging device.

(23) A solid-state imaging device, including:
a substrate on which a plurality of photoelectric conversion units has been formed; and
a groove portion provided on a side of a light-receiving surface of the substrate, in which
a cross-sectional shape of a side wall surface of the groove portion is an arc shape protruding outward or inward in a width direction of the groove portion.

(24) A solid-state imaging device, including:
a substrate on which a plurality of photoelectric conversion units has been formed; and
a groove portion provided on a side of a light-receiving surface of the substrate, in which
a bottom surface of the groove portion has a shape in which
a plurality of cone-shaped solids is arranged in array.

(25) A solid-state imaging device, including:
a substrate on which a plurality of photoelectric conversion units has been formed; and
a groove portion provided on a side of a light-receiving surface of the substrate, in which
a part or all of the groove portion is filled to an opening with a material different from that of the substrate.

(26) A solid-state imaging device, including:
a substrate on which a plurality of photoelectric conversion units has been formed; and
a groove portion provided on a side of a light-receiving surface of the substrate, in which
a width of the groove portion varies from one place to another in a longitudinal direction of the groove portion so that incident light reflected by the groove portion goes out of the groove portion and then is directed in a direction opposite to a side of the plurality of photoelectric conversion units.

(27) A solid-state imaging device, including:
a substrate on which a plurality of photoelectric conversion units has been formed; and
a groove portion provided on a side of a light-receiving surface of the substrate, in which
a distance between a pixel region including a plurality of photoelectric conversion units and the groove portion varies from one place to another in a longitudinal direction of the groove portion so that incident light reflected by the groove portion goes out of the groove portion and then is directed in a direction opposite to a side of the plurality of photoelectric conversion units.

(28) An electronic apparatus, including:
a solid-state imaging device that includes a substrate on which a plurality of photodiodes has been formed, a groove portion provided on a side of a light-receiving surface of the substrate, and recessed and projecting portions provided inside the groove portion;
an optical lens that forms an image of image light from a subject onto an imaging surface of the solid-state imaging device; and
a signal processing circuit that performs signal processing on a signal output from the solid-state imaging device.

REFERENCE SIGNS LIST 1 solid-state imaging device, 2 substrate, 3 pixel region, 4 vertical drive circuit, 5 column signal processing circuit, 6 horizontal drive circuit, 7 output circuit, 8 control circuit, 9 pixel, 10 pixel drive wiring, 11 vertical signal line, 12 horizontal signal line, 13 chip, 14 surrounding region, 15 protective film, 16 light-shielding film, 17 flattening film, 18 light receiving layer, 19 color filter layer, 20 on-chip lens, 21 light collection layer, 22 wiring layer, 23 support substrate, 24 photoelectric conversion unit, 25 scribe region, 26 wafer, 27 scribe region, 28 groove portion, 29a, 29b, 29c, 29d straight groove, 30 side wall surface, 31 recessed and projecting portions, 32 camera module, 33 cover glass, 34a imaging lens, 34b imaging lens, 34c imaging lens, 34d imaging lens, 34e imaging lens, 35 incident light, 36 tangent, 37 projecting portion, 50, 51, 52 reference surface, 53 cone-shaped solid, 54 a side wall surface, 55 material, 56 resist, 57 silicon nitride film, 58 ultraviolet rays, 59 sphere, 60 etching plate, 61 isosceles triangle, 62 deblock copolymer, 63 first rectangular column, 64 second rectangular column, 100 electronic apparatus, 101 solid-state imaging device, 102 optical lens, 103 shutter device, 104 drive circuit, 105 signal processing circuit, 106 incident light

The invention claimed is:
1. A solid-state imaging device, comprising:
a substrate on which a plurality of photoelectric conversion units has been formed;
a groove portion provided on a side of a light-receiving surface of the substrate; and
recessed and projecting portions provided on a side wall surface of the groove portion facing a side of the plurality of photoelectric conversion units.

2. The solid-state imaging device according to claim 1, wherein
the recessed and projecting portions have a shape that scatters incident light from the side of the light-receiving surface of the substrate.

3. The solid-state imaging device according to claim 1, wherein
a pitch of irregularities of the recessed and projecting portions is 0.1 um or more and less than 100 um, the pitch being a distance between bottom portions of adjacent recessed portions or a distance between apexes of adjacent projecting portions in plan view.

4. The solid-state imaging device according to claim 1, wherein
the recessed and projecting portions have a saw blade shape in which triangles are consecutive as viewed from the side of the light-receiving surface of the substrate.

5. The solid-state imaging device according to claim 4, wherein
an angle of each of the triangles of the recessed and projecting portions is 1° or more and less than 80°.

6. The solid-state imaging device according to claim 5, wherein
the angle of each of the triangles of the recessed and projecting portions is 1° or more and 60° or less.

7. The solid-state imaging device according to claim 6, wherein
the angle of each of the triangles of the recessed and projecting portions is 30°±10°.

8. The solid-state imaging device according to claim 3, wherein
a shape of each of the triangles varies from one place to another in a longitudinal direction of the groove portion.

9. The solid-state imaging device according to claim 8, wherein
the groove portion is provided between a scribe region and a pixel region to have a rectangular shape surrounding the pixel region, the scribe region being diced by a blade, the pixel region including the plurality of photoelectric conversion units, and
the recessed and projecting portions are formed on the side wall surface on a side of a central portion of the pixel region to have an isosceles triangle shape and on the side wall surface on a side of an end portion of the pixel region to have a triangular shape having a side on the end portion being longer than a side on the central portion.

10. The solid-state imaging device according to claim 1, wherein
the recessed and projecting portions have a shape obtained by arranging a plurality of cone-shaped solids in array.

11. The solid-state imaging device according to claim 1, wherein
the recessed and projecting portions are provided on each of two side wall surfaces of the groove portion.

12. The solid-state imaging device according to claim 1, wherein
the substrate is formed of silicon.

13. The solid-state imaging device according to claim 1, wherein
the groove portion is provided between a scribe region and a pixel region to have a rectangular shape surrounding the pixel region, the scribe region being diced by a blade, the pixel region including the plurality of photoelectric conversion units.

14. The solid-state imaging device according to claim 13, wherein
the recessed and projecting portions are provided only on a side wall surface of the groove portion forming sides of the rectangular shape, the side wall surface facing a side of the pixel region, a distance between the side wall surface and the pixel region being less than or equal to a predetermined value.

* * * * *